United States Patent
Lu et al.

(10) Patent No.: US 12,464,782 B2
(45) Date of Patent: Nov. 4, 2025

(54) TRANSISTOR WITH CONTROLLABLE SOURCE/DRAIN STRUCTURE

(71) Applicants: Invention And Collaboration Laboratory Pte. Ltd., Singapore (SG); ETRON TECHNOLOGY, INC., Hsinchu (TW)

(72) Inventors: Chao-Chun Lu, Hsinchu (TW); Li-Ping Huang, Hsinchu (TW)

(73) Assignees: INVENTION AND COLLABORATION LABORATORY PTE. LTD., Singapore (SG); ETRON TECHNOLOGY, INC., Hsinchu (TW)

( * ) Notice: Subject to any disclaimer, the term of this patent is extended or adjusted under 35 U.S.C. 154(b) by 678 days.

(21) Appl. No.: 17/751,727

(22) Filed: May 24, 2022

(65) Prior Publication Data

US 2023/0027524 A1    Jan. 26, 2023

Related U.S. Application Data

(60) Provisional application No. 63/224,921, filed on Jul. 23, 2021.

(51) Int. Cl.
*H10D 62/10* (2025.01)
*H10B 12/00* (2023.01)
(Continued)

(52) U.S. Cl.
CPC ......... *H10D 62/102* (2025.01); *H10B 12/053* (2023.02); *H10B 12/488* (2023.02);
(Continued)

(58) Field of Classification Search
CPC ............ H10D 30/7657; H10D 30/637; H10D 62/102; H10D 64/512; H10D 64/513; H10B 12/053; H10B 12/488
(Continued)

(56) References Cited

U.S. PATENT DOCUMENTS

| | | | | |
|---|---|---|---|---|
| 6,093,947 A | * | 7/2000 | Hanafi | H10D 30/603 257/E21.429 |
| 7,319,255 B2 | * | 1/2008 | Hwang | H10D 64/513 257/329 |

(Continued)

FOREIGN PATENT DOCUMENTS

| | | |
|---|---|---|
| CN | 1874003 A | 12/2006 |
| CN | 101140950 A | 3/2008 |

(Continued)

OTHER PUBLICATIONS

CN Office Action dated Dec. 5, 2023 in Chinese application No. 2022-117535.

(Continued)

*Primary Examiner* — Igwe U Anya
(74) *Attorney, Agent, or Firm* — McClure, Qualey & Rodack, LLP

(57) ABSTRACT

A transistor structure includes a substrate, a gate conductive region, a gate dielectric layer and a first conductive region. At least a portion of the gate conductive region is disposed below a surface of the substrate. The gate dielectric layer surrounds a bottom wall and sidewalls of the gate conductive region. A bottom wall of the first conductive region is aligned or substantially aligned with a top wall of the gate conductive region.

21 Claims, 24 Drawing Sheets

(51) Int. Cl.
  *H10D 30/63* (2025.01)
  *H10D 30/67* (2025.01)
  *H10D 64/01* (2025.01)
  *H10D 64/27* (2025.01)

(52) U.S. Cl.
  CPC ..... *H10D 30/6715* (2025.01); *H10D 30/6757* (2025.01); *H10D 64/01* (2025.01); *H10D 64/512* (2025.01); *H10D 30/637* (2025.01); *H10D 64/513* (2025.01)

(58) Field of Classification Search
  USPC .......................................................... 257/288
  See application file for complete search history.

(56) References Cited

U.S. PATENT DOCUMENTS

| | | | |
|---|---|---|---|
| 7,612,406 B2 | 11/2009 | Kluge | |
| 8,053,307 B2 | 11/2011 | Seo et al. | |
| 8,597,998 B2 | 12/2013 | Bhalla et al. | |
| 10,043,854 B1 | 8/2018 | Shin | |
| 2001/0009800 A1* | 7/2001 | Hijzen | H10D 30/061 257/E21.384 |
| 2006/0273388 A1* | 12/2006 | Yamazaki | H10D 30/608 257/E21.429 |
| 2007/0007571 A1* | 1/2007 | Lindsay | H10D 84/0167 257/E21.345 |
| 2008/0061320 A1 | 3/2008 | von Kluge | |
| 2008/0253160 A1 | 10/2008 | Popp | |
| 2013/0313637 A1 | 11/2013 | Yoshida | |
| 2015/0340368 A1 | 11/2015 | Oshima | |
| 2018/0097081 A1 | 4/2018 | Cao | |
| 2020/0006488 A1* | 1/2020 | Mehandru | H01L 21/74 |
| 2021/0375744 A1 | 12/2021 | Huang | |

FOREIGN PATENT DOCUMENTS

| | | | | |
|---|---|---|---|---|
| CN | 102683407 A | | 9/2012 | |
| DE | 4408764 A1 | * | 9/1994 | ....... H01L 27/10823 |
| JP | 2003282869 A | | 10/2003 | |
| JP | 2008530800 A | | 8/2008 | |
| KR | 100714900 B1 | | 5/2007 | |
| KR | 20180130189 A | * | 12/2018 | .......... H10D 64/513 |
| TW | 200818468 A | | 4/2008 | |
| WO | 2014103734 A1 | | 7/2014 | |
| WO | 2014125950 A1 | | 8/2014 | |

OTHER PUBLICATIONS

CN Office Action dated Dec. 5, 2023 in Chinese application No. 2022-117537.
TW Office Action dated Feb. 14, 2023 in Taiwan application No. 111120281.
KR Office Action dated Dec. 13, 2023 in Korean Application No. 10-2022-0091245.
Non-Final Office Action issued in U.S. Appl. No. 17/828,304, filed May 31, 2022, mailed Jan. 19, 2024.
Non-Final Office Action issued in U.S. Appl. No. 17/813,656, filed Jul. 20, 2022, mailed Jan. 15, 2025.
Non-Final Office Action issued in U.S. Appl. No. 17/813,656, filed Jul. 20, 2022, mailed Apr. 29, 2025
CN Office Action dated Mar. 1, 2025 in Chinese application No. 202210624636.8.

* cited by examiner

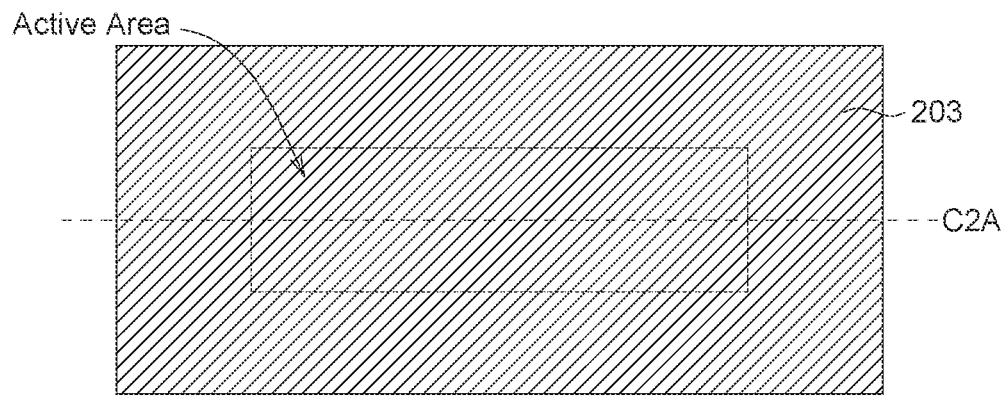
FIG. 2A(1)
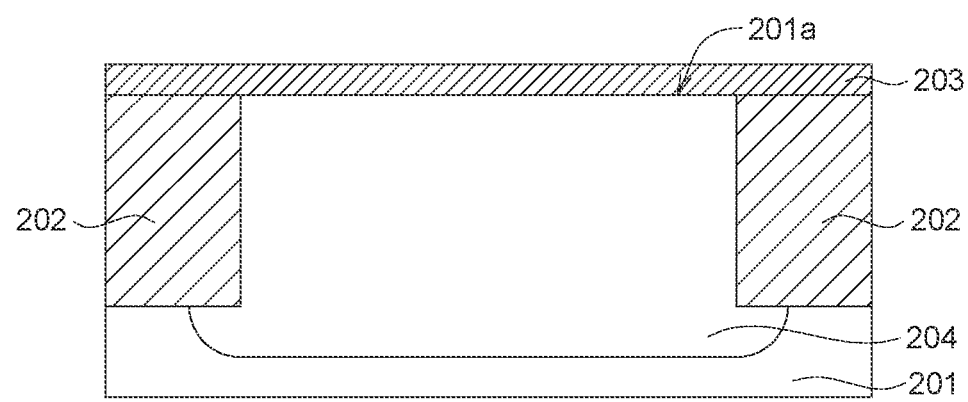
FIG. 2A(2)

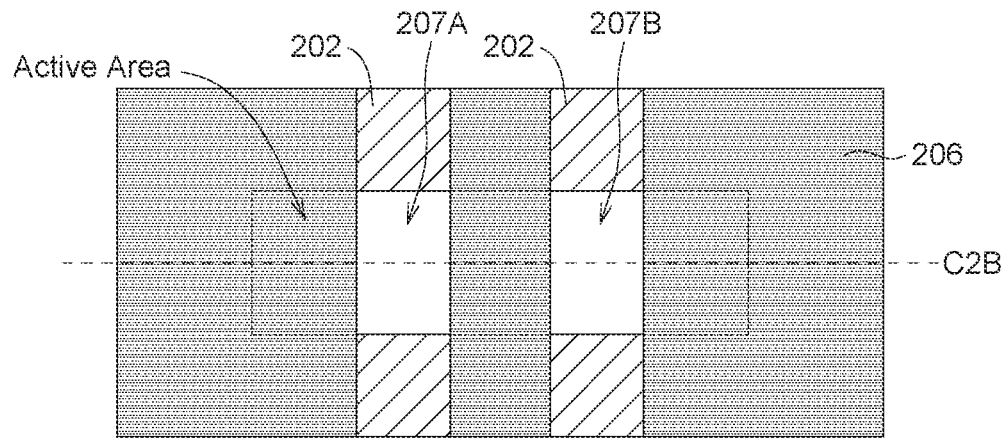
FIG. 2B(1)
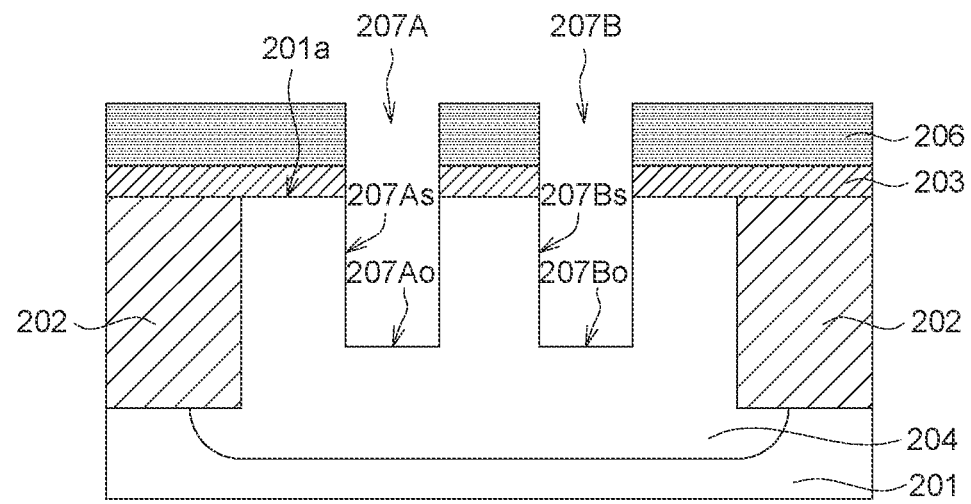
FIG. 2B(2)

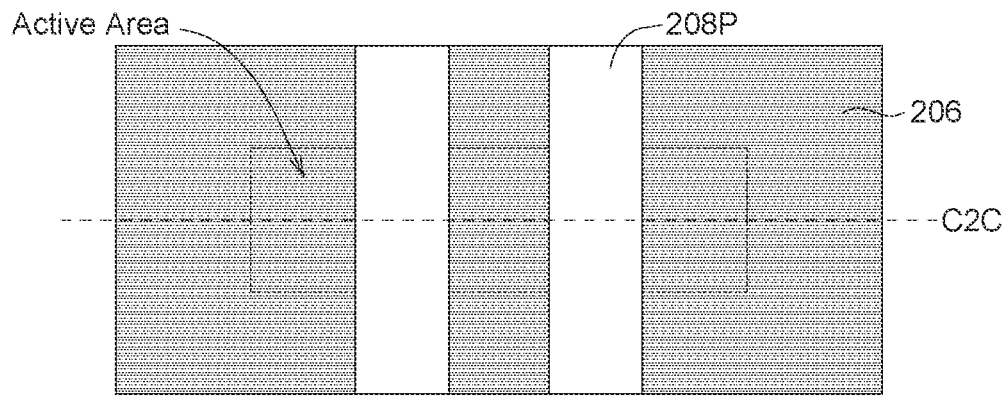
FIG. 2C(1)
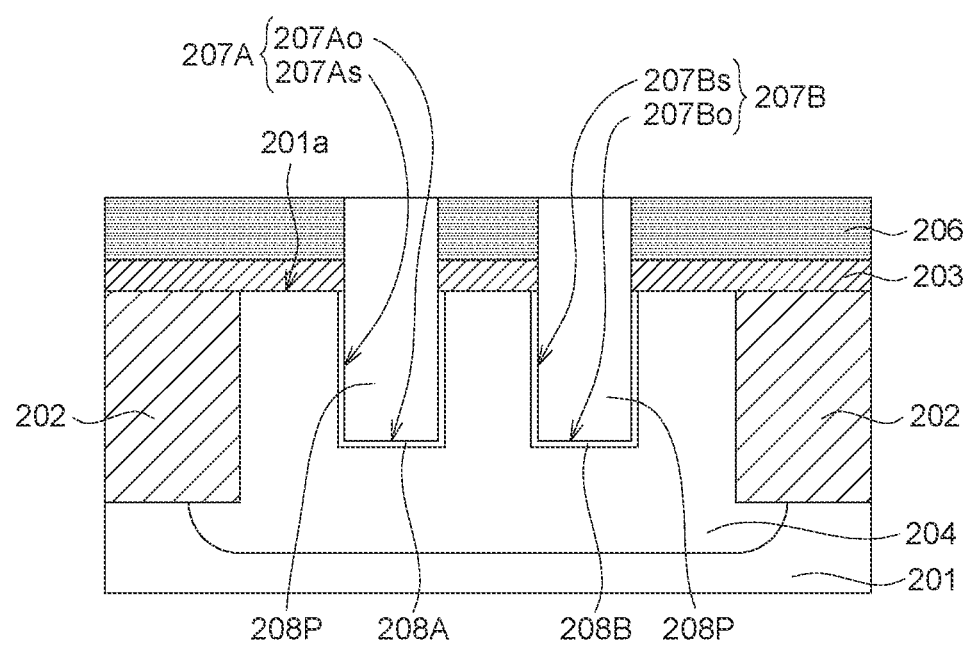
FIG. 2C(2)

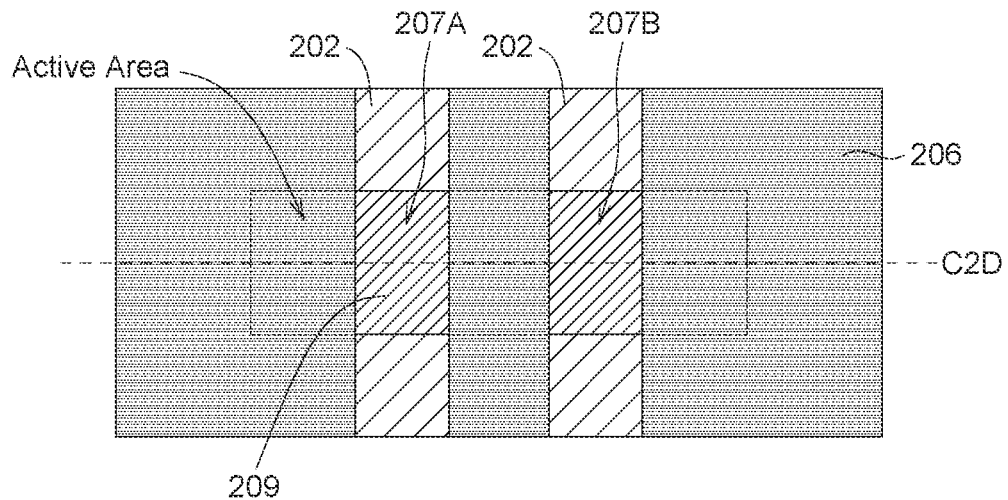
FIG. 2D(1)
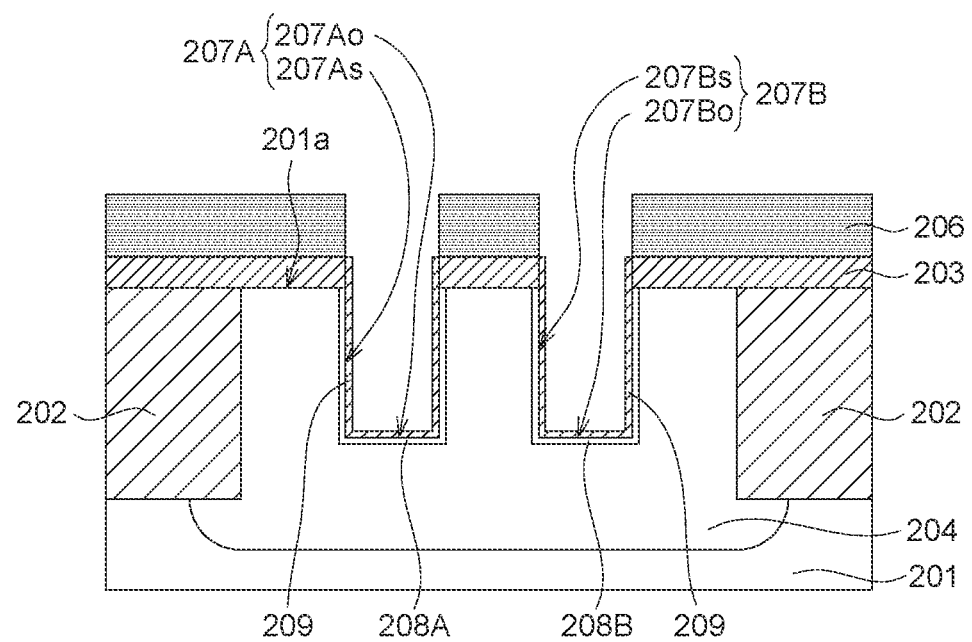
FIG. 2D(2)

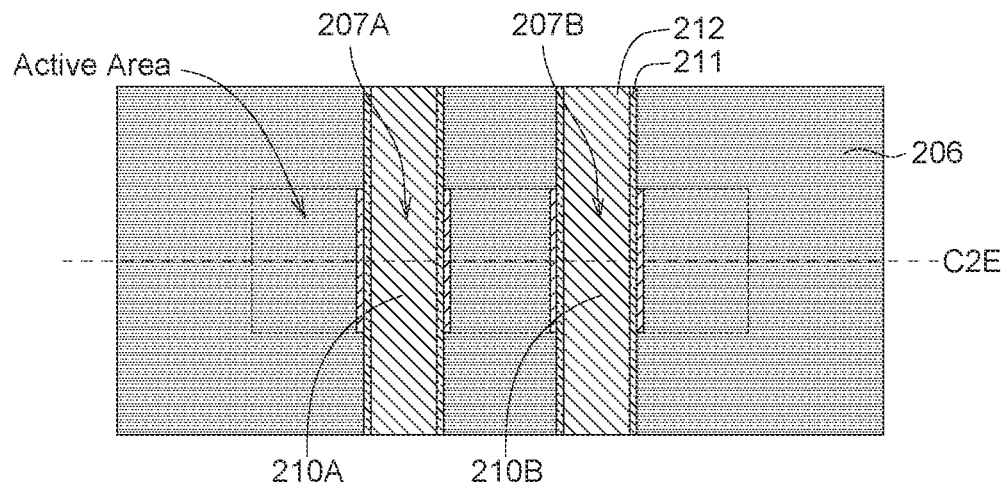
FIG. 2E(1)
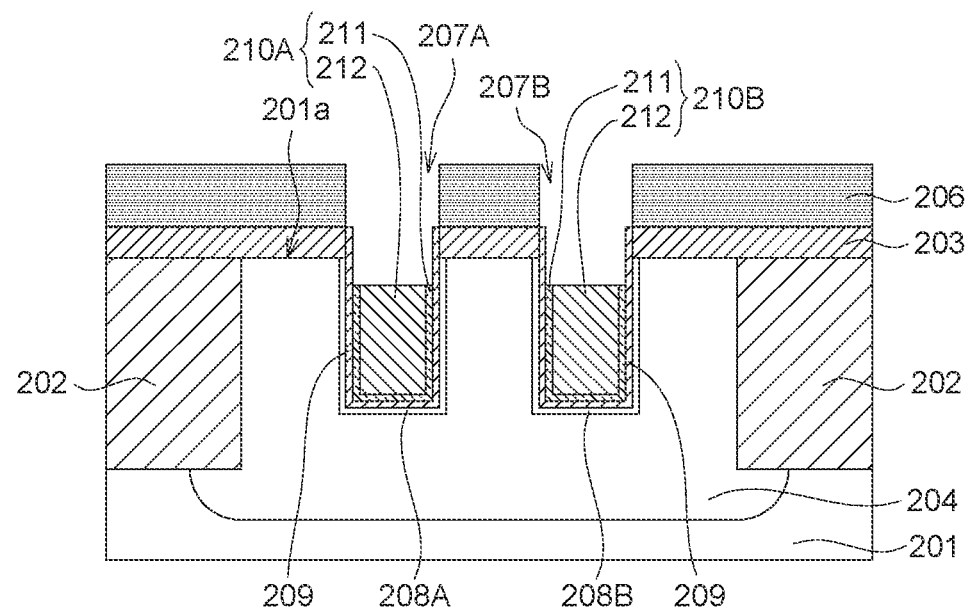
FIG. 2E(2)

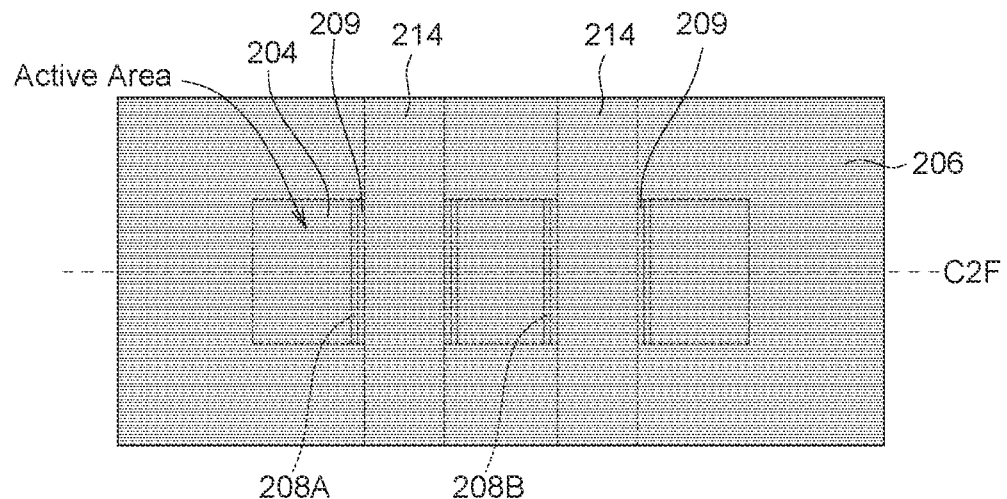
FIG. 2F(1)
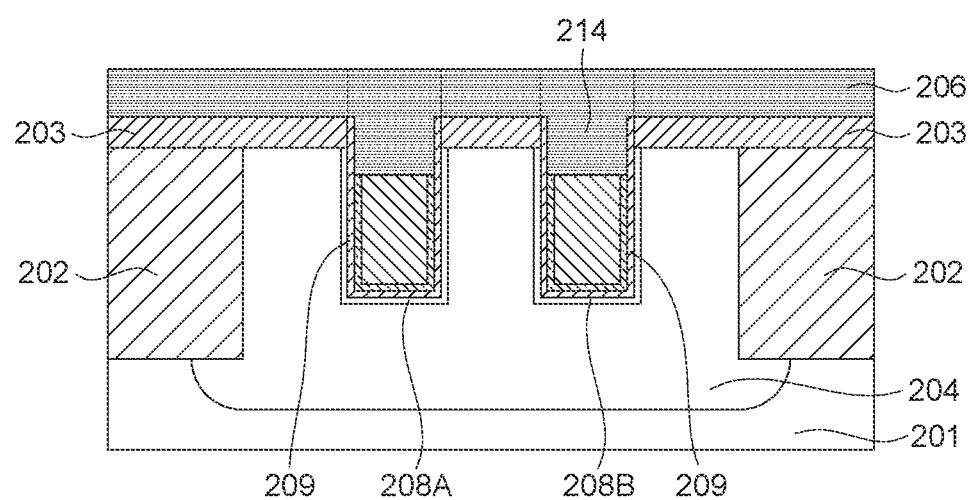
FIG. 2F(2)

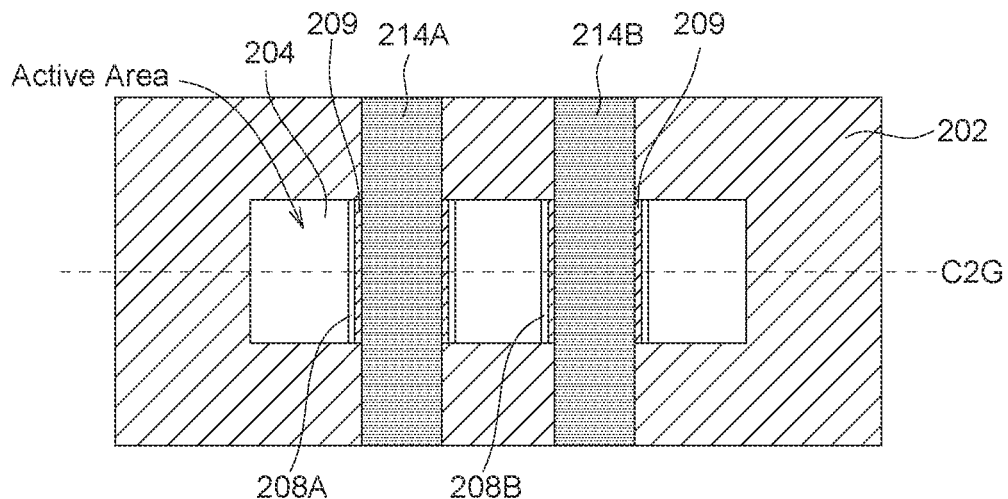
FIG. 2G(1)
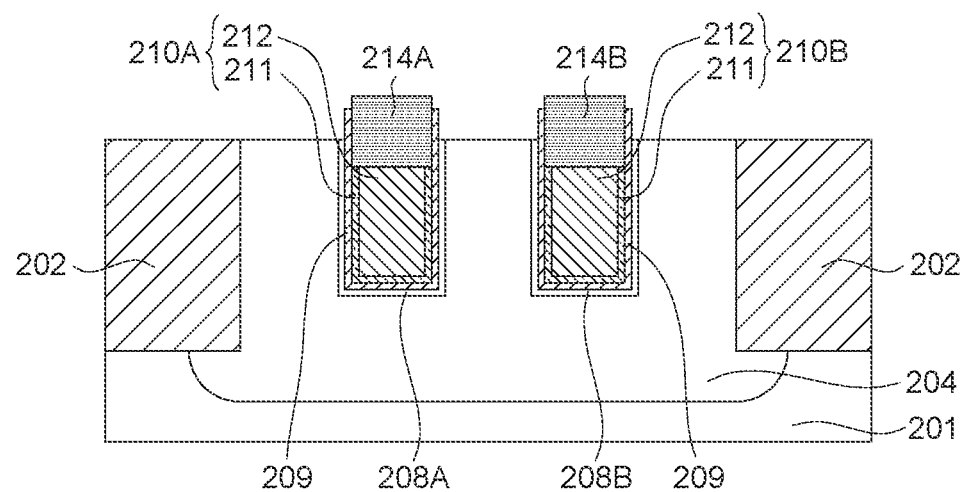
FIG. 2G(2)

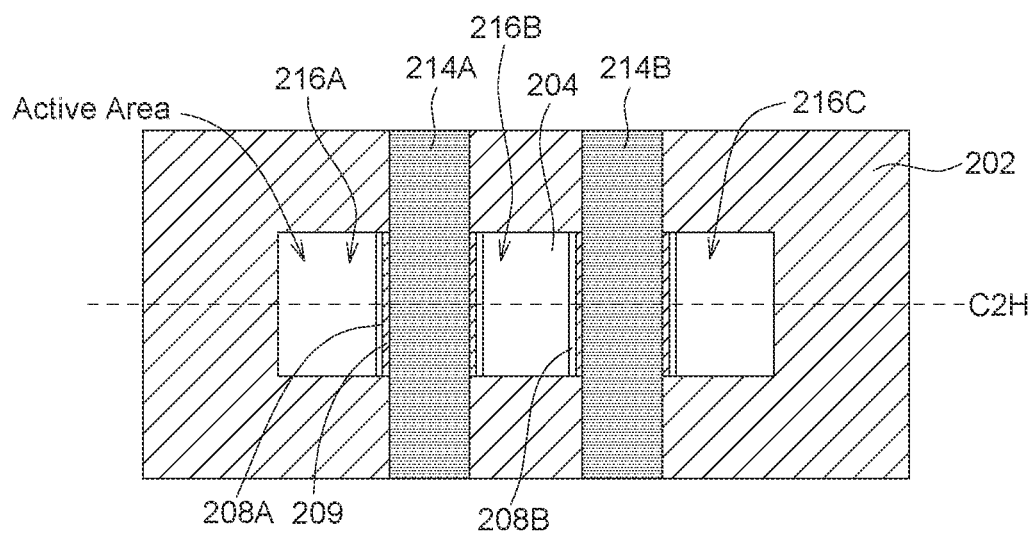
FIG. 2H(1)

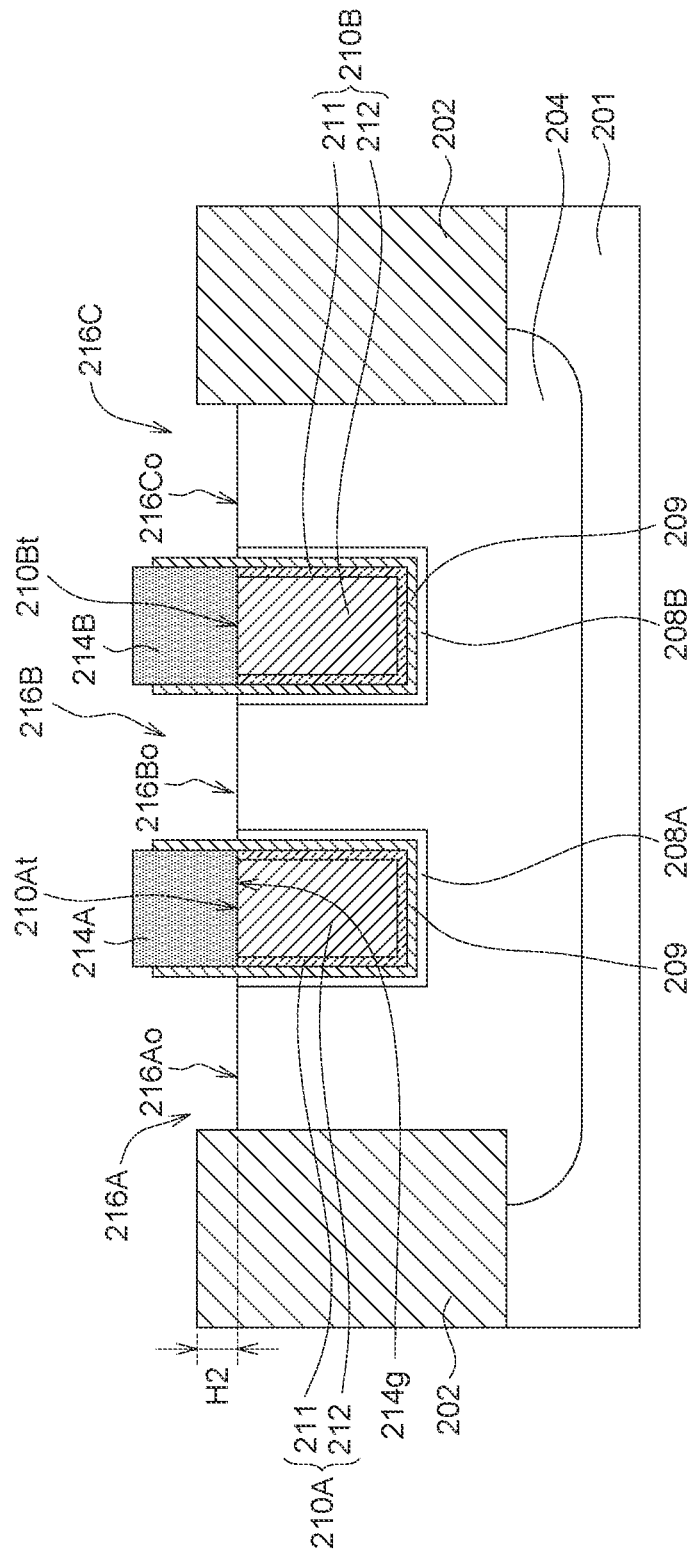
FIG. 2H(2)

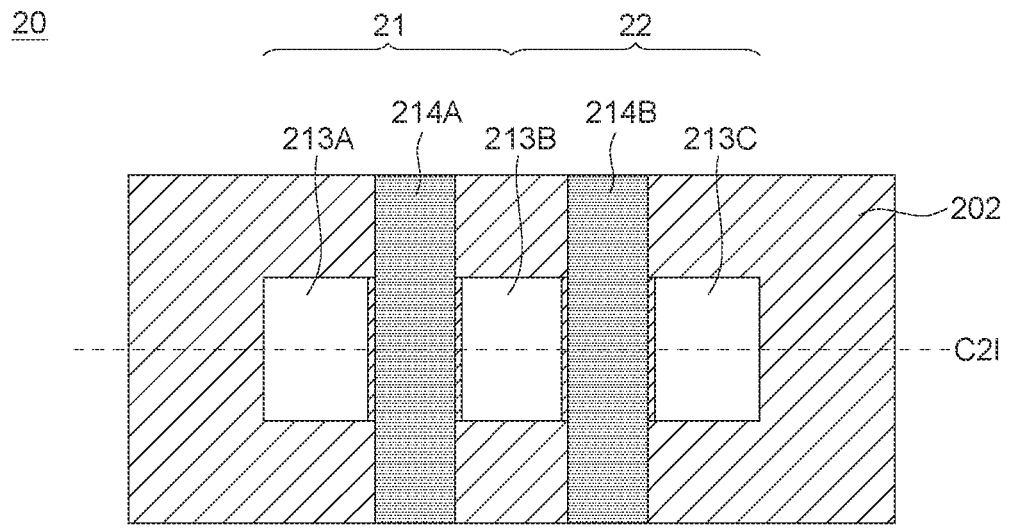
FIG. 2I(1)
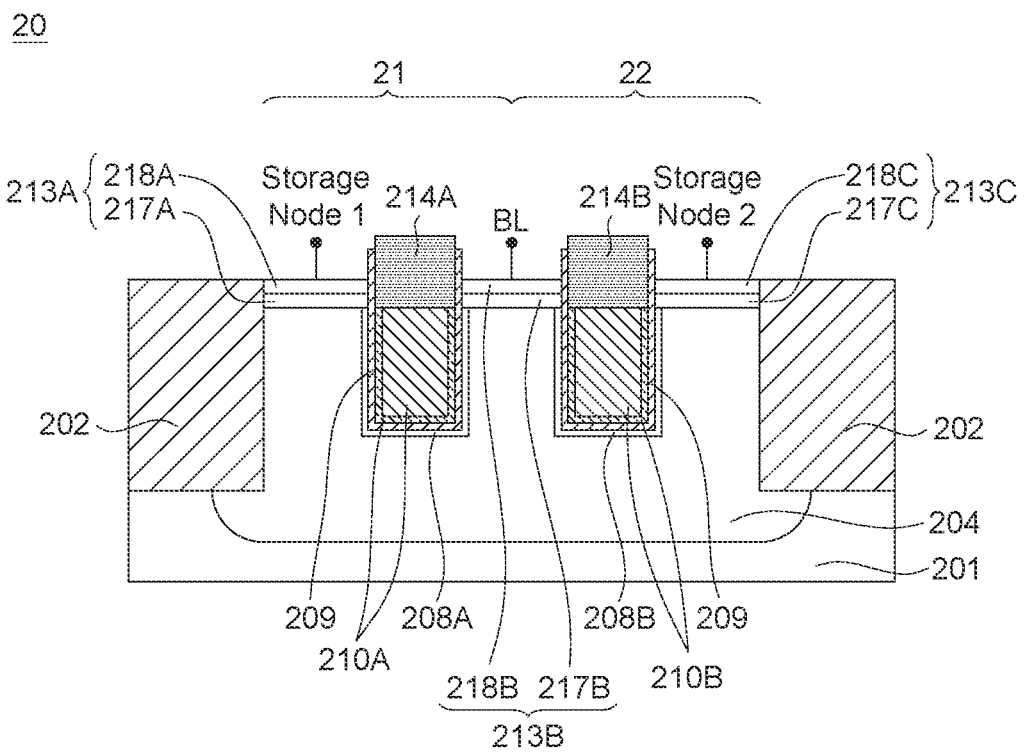
FIG. 2I(2)

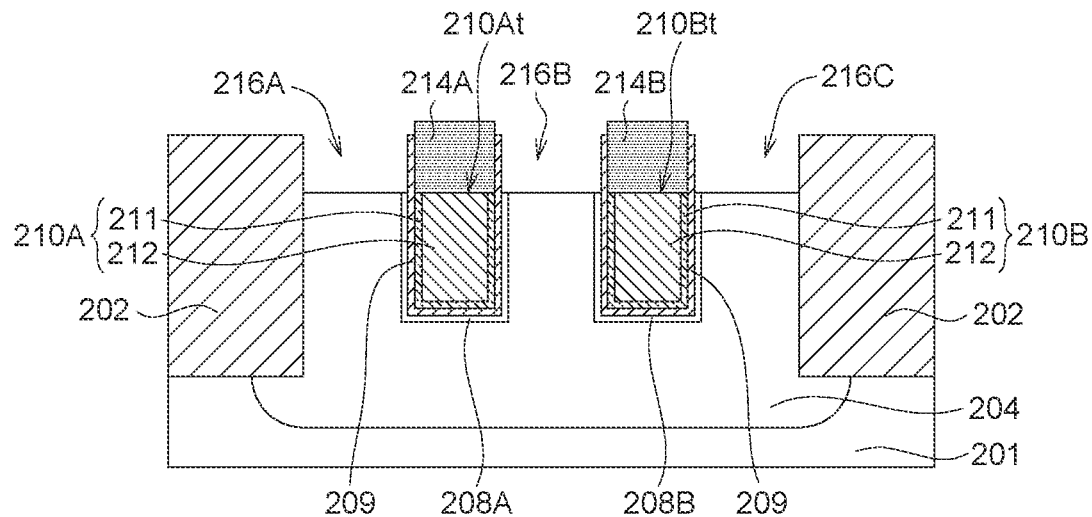
FIG. 2J(1)
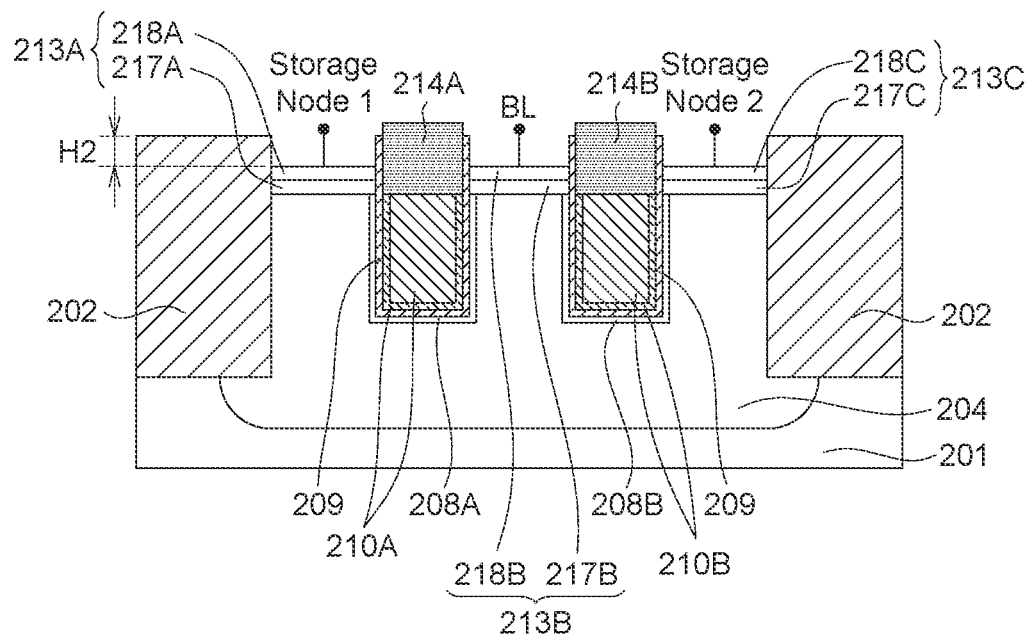
FIG. 2J(2)

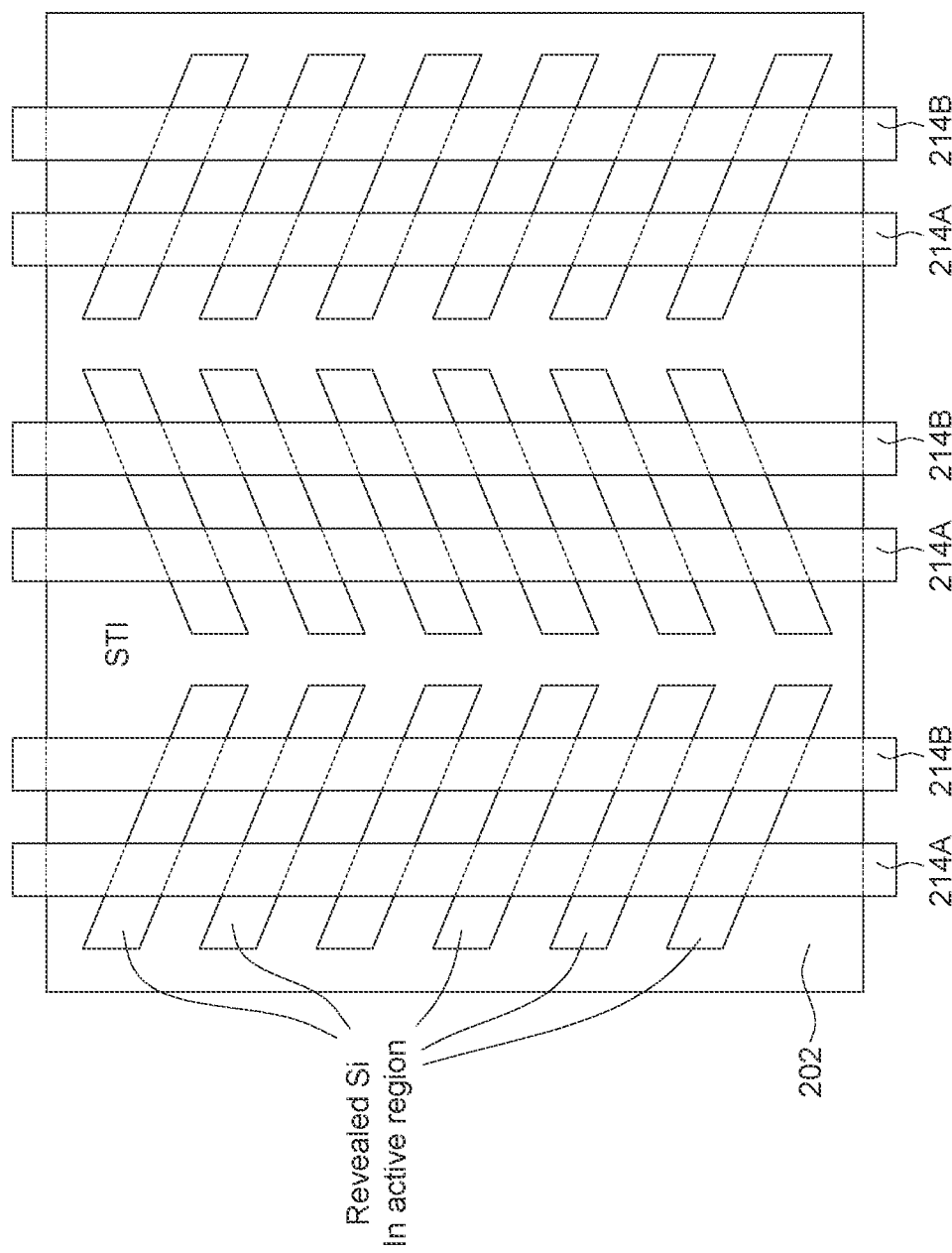

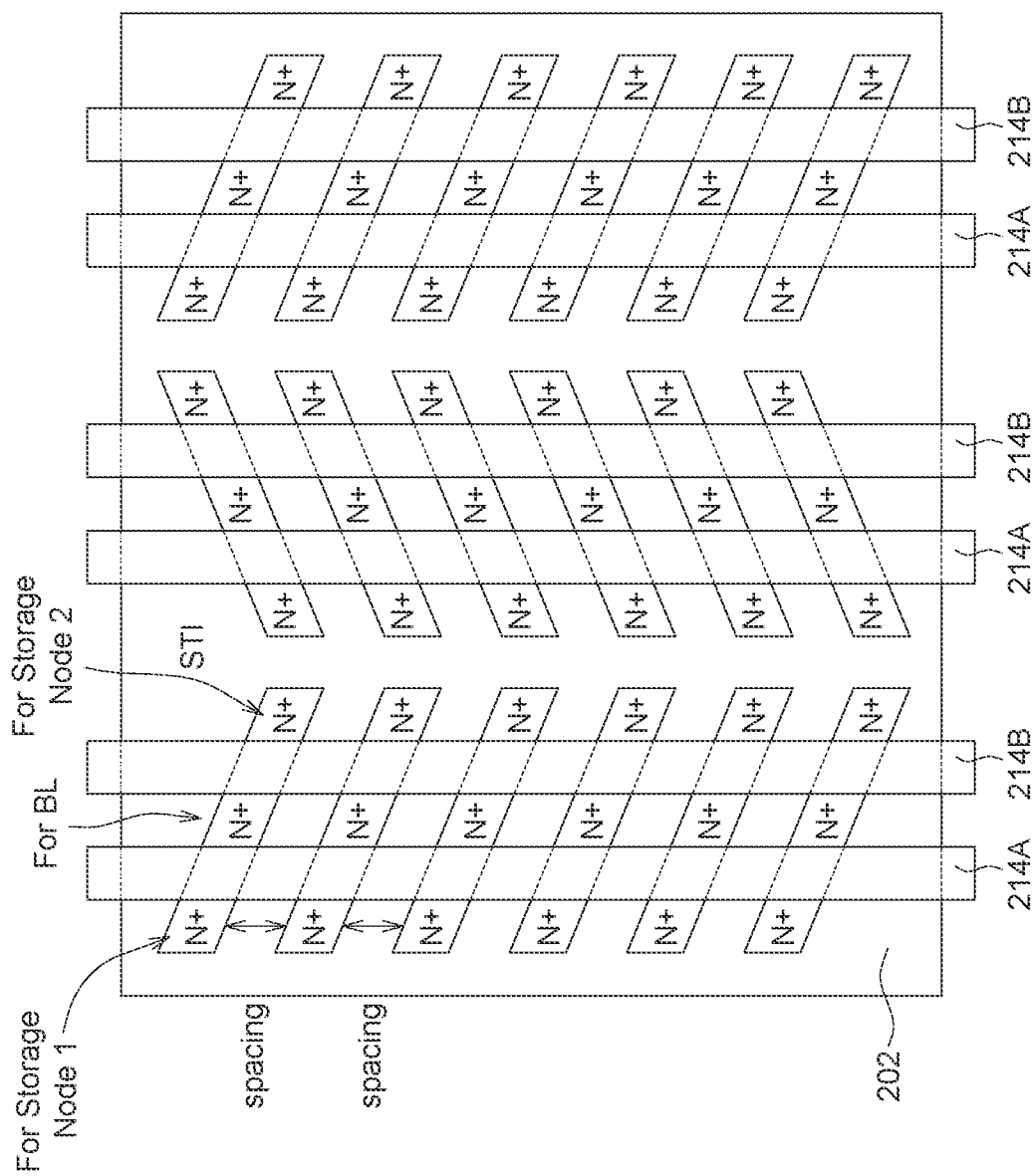
FIG. 2K(2)

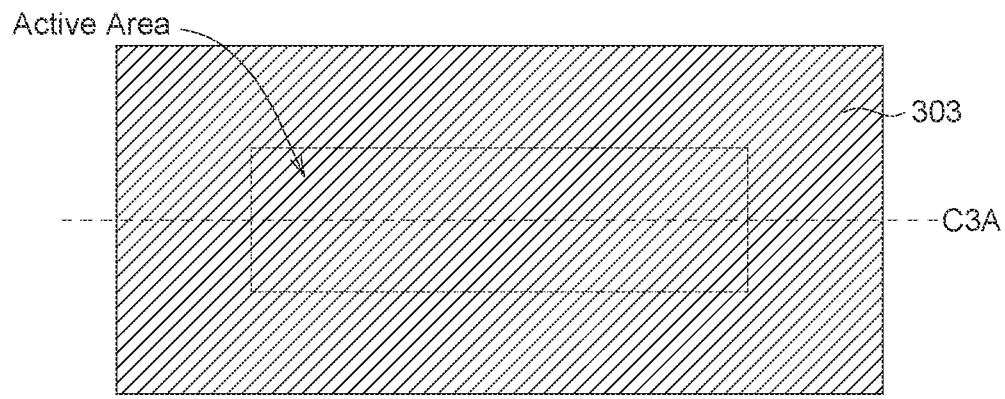
FIG. 3A(1)
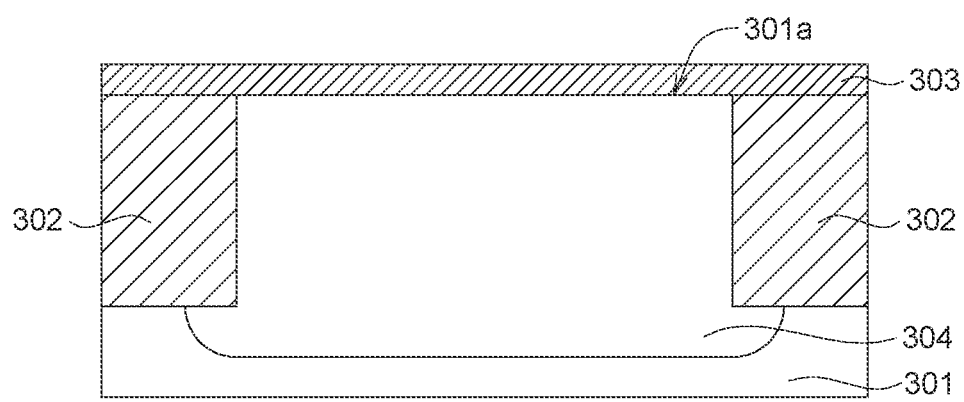
FIG. 3A(2)

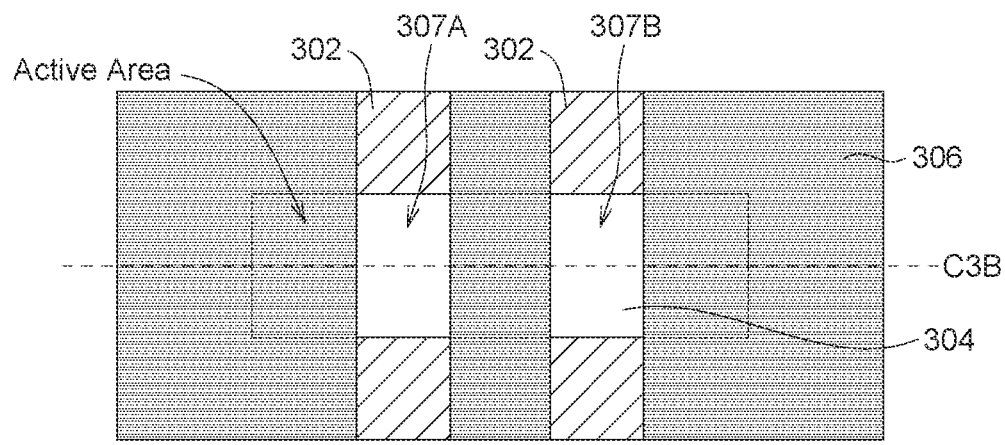
FIG. 3B(1)
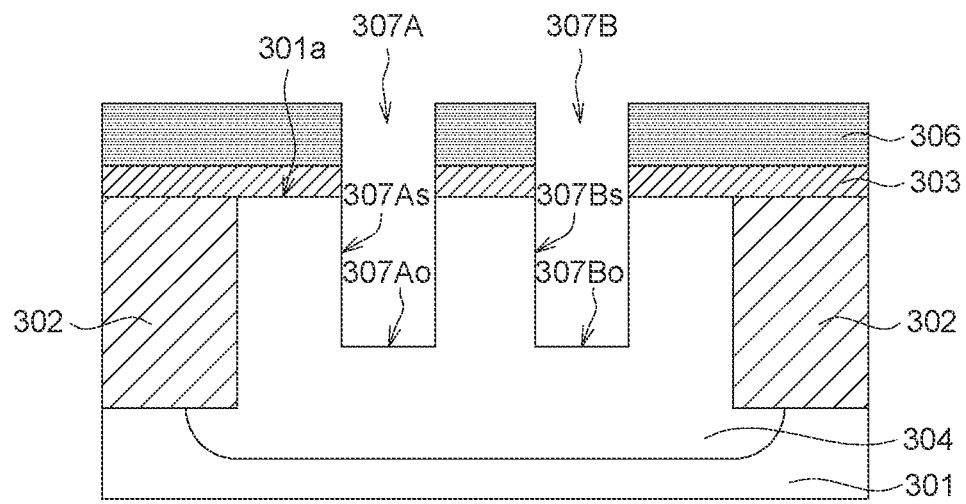
FIG. 3B(2)

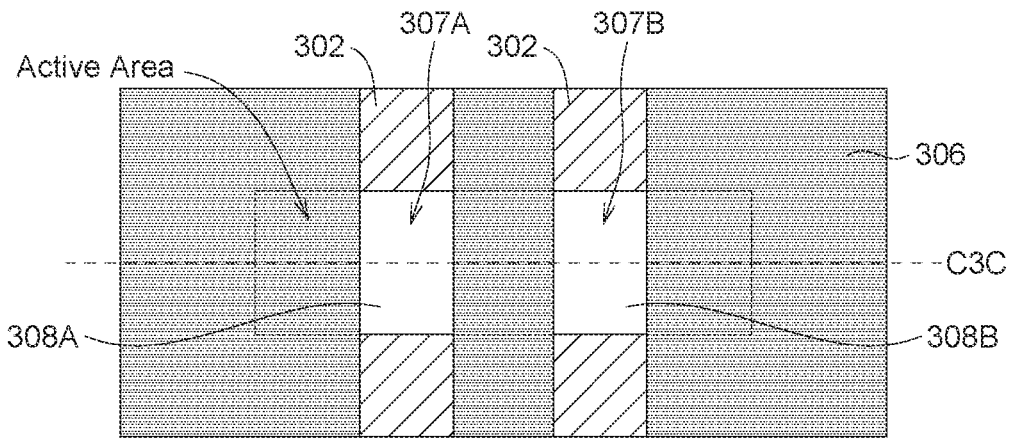
FIG. 3C(1)
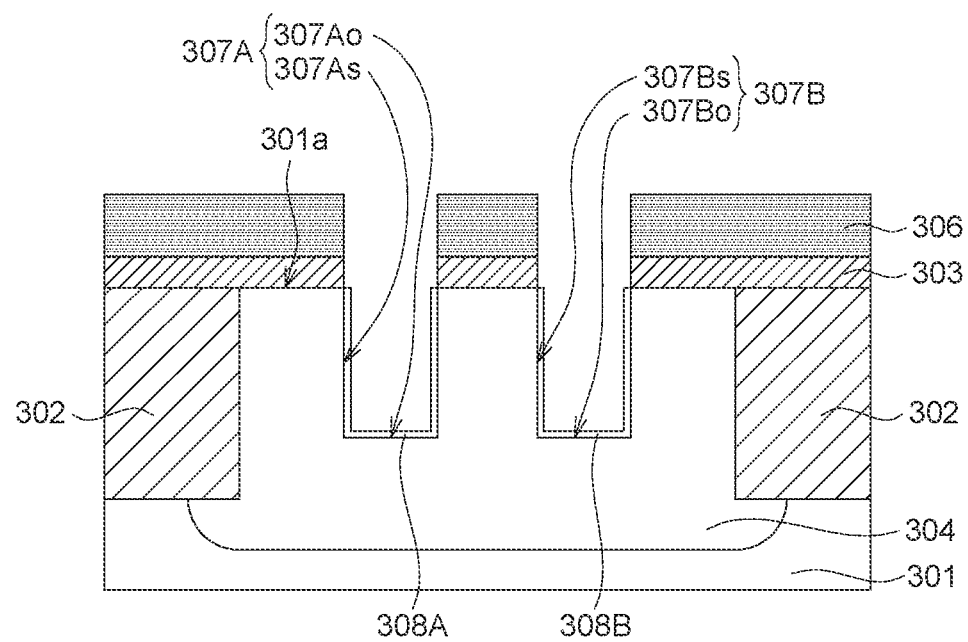
FIG. 3C(2)

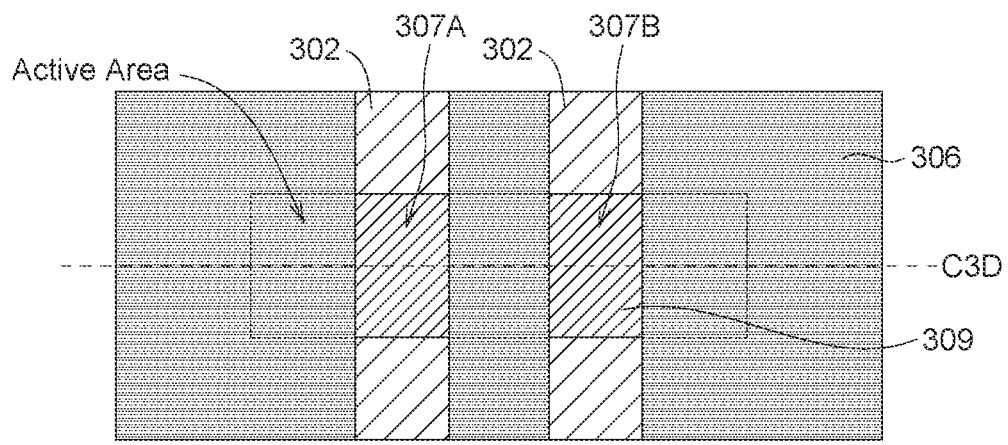
FIG. 3D(1)
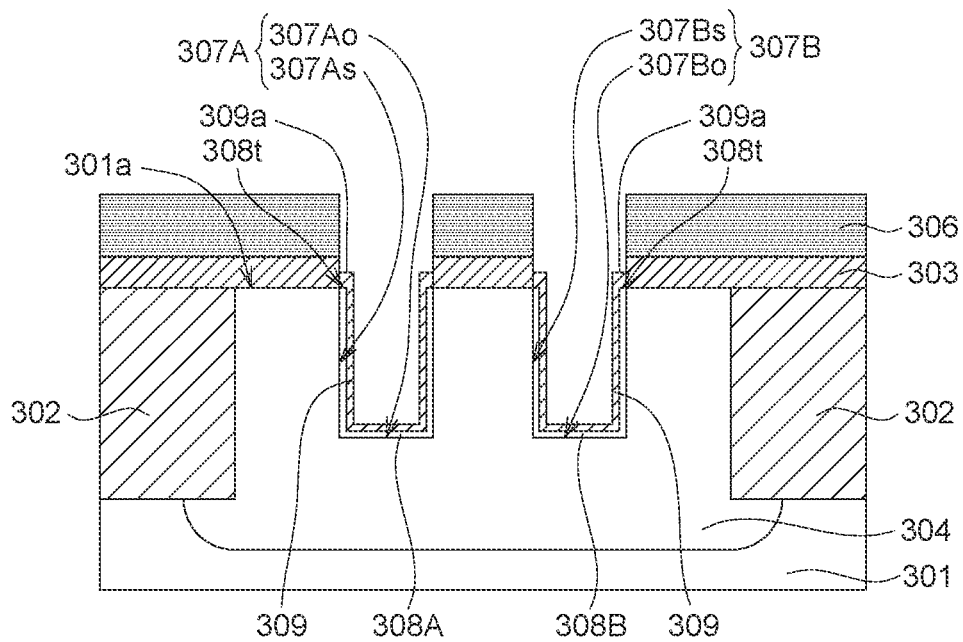
FIG. 3D(2)

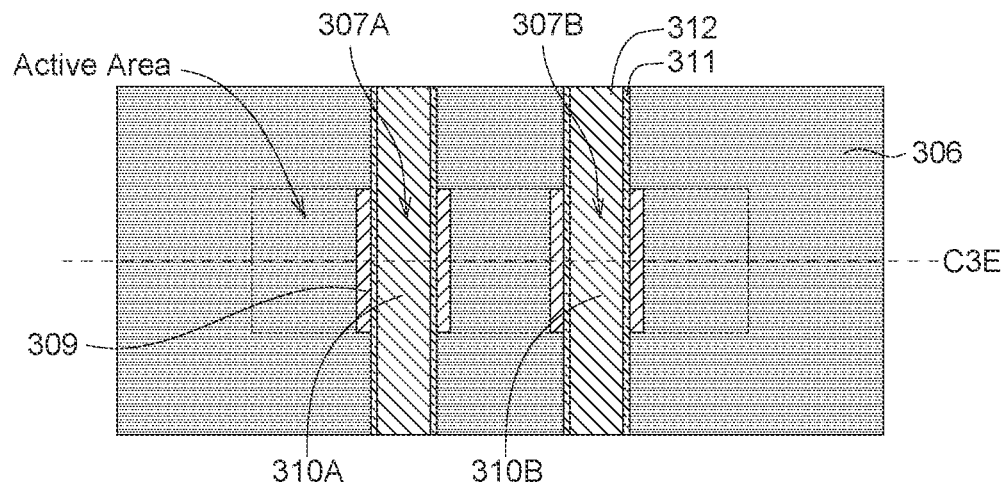
FIG. 3E(1)
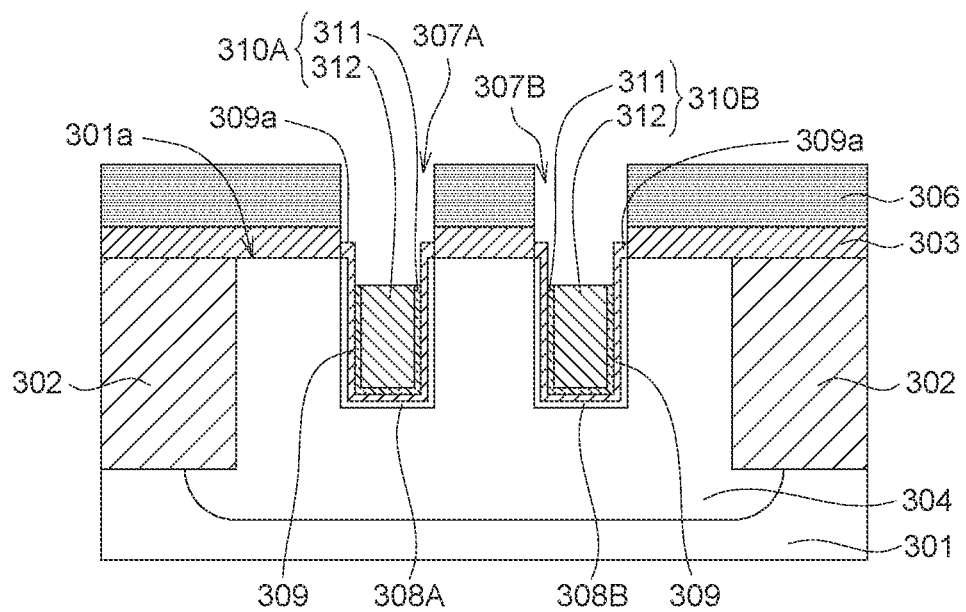
FIG. 3E(2)

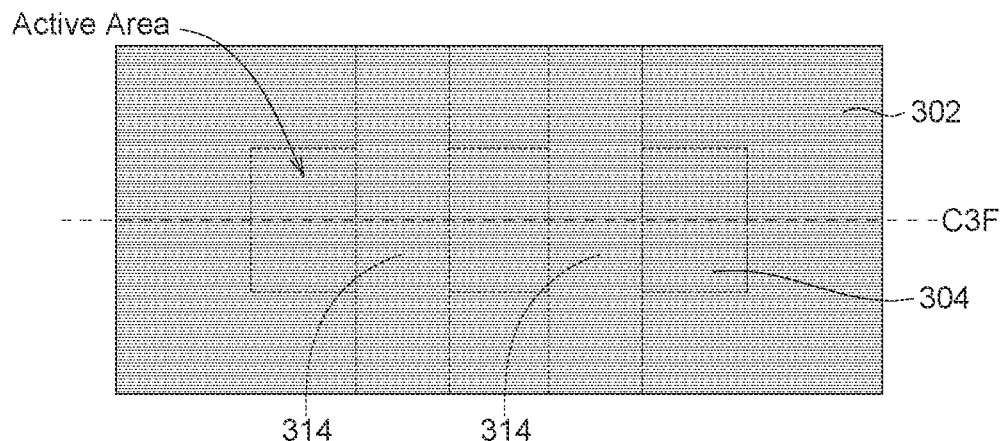
FIG. 3F(1)
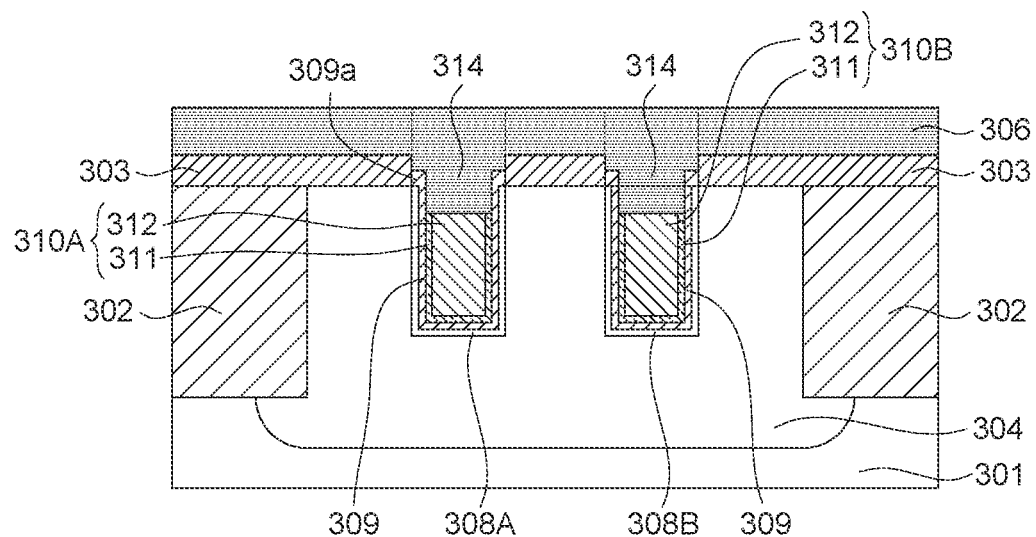
FIG. 3F(2)

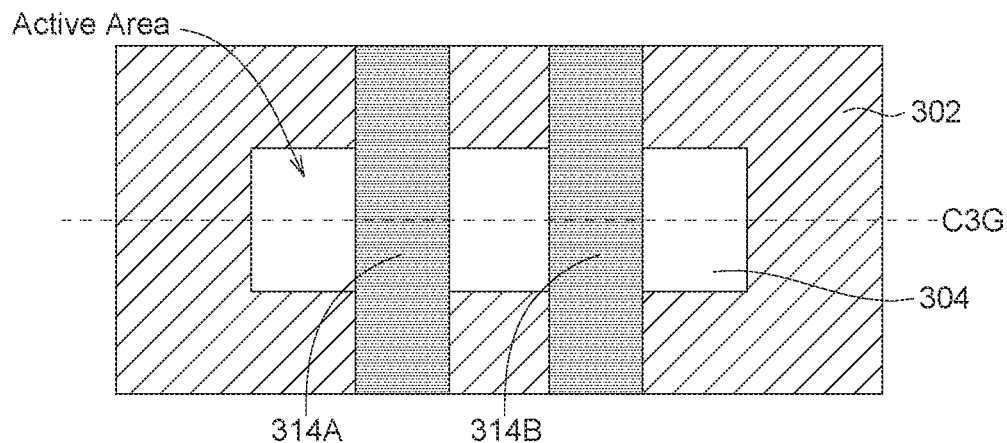
FIG. 3G(1)
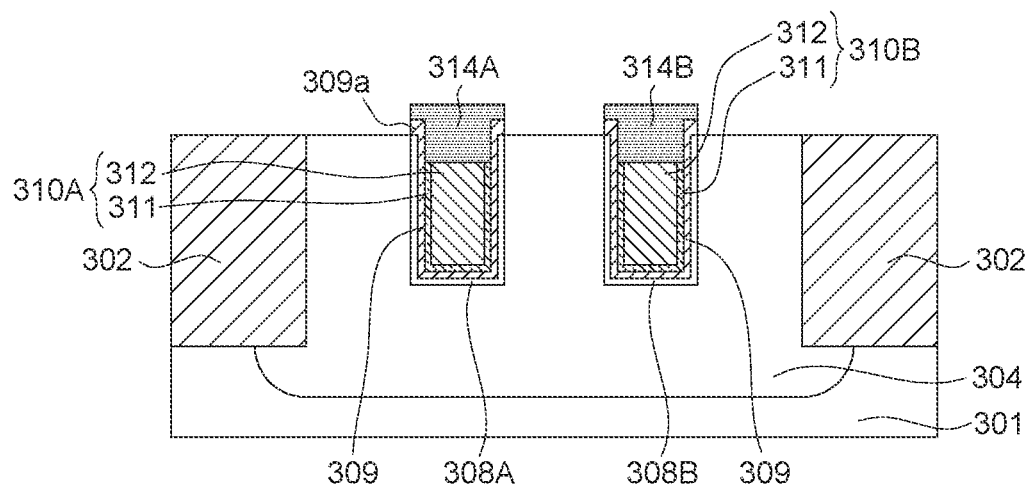
FIG. 3G(2)

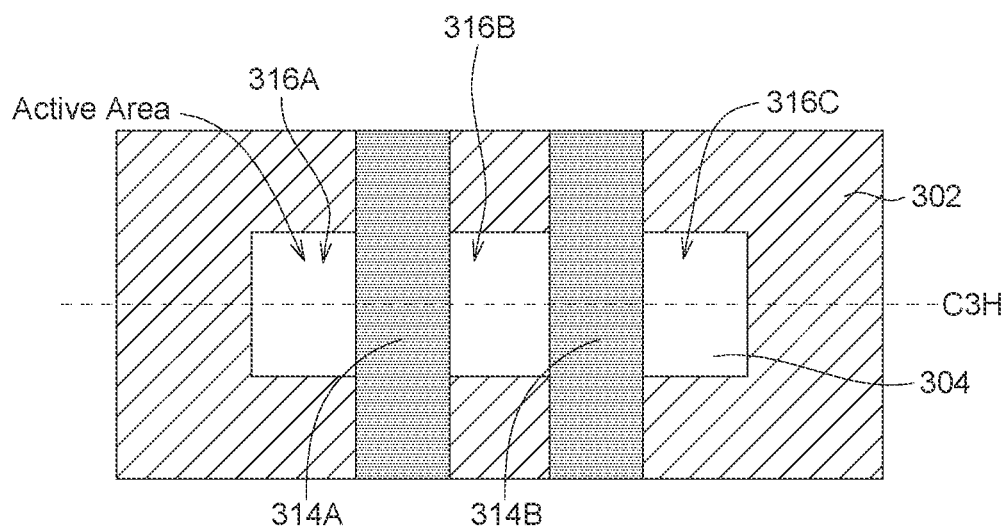
FIG. 3H(1)

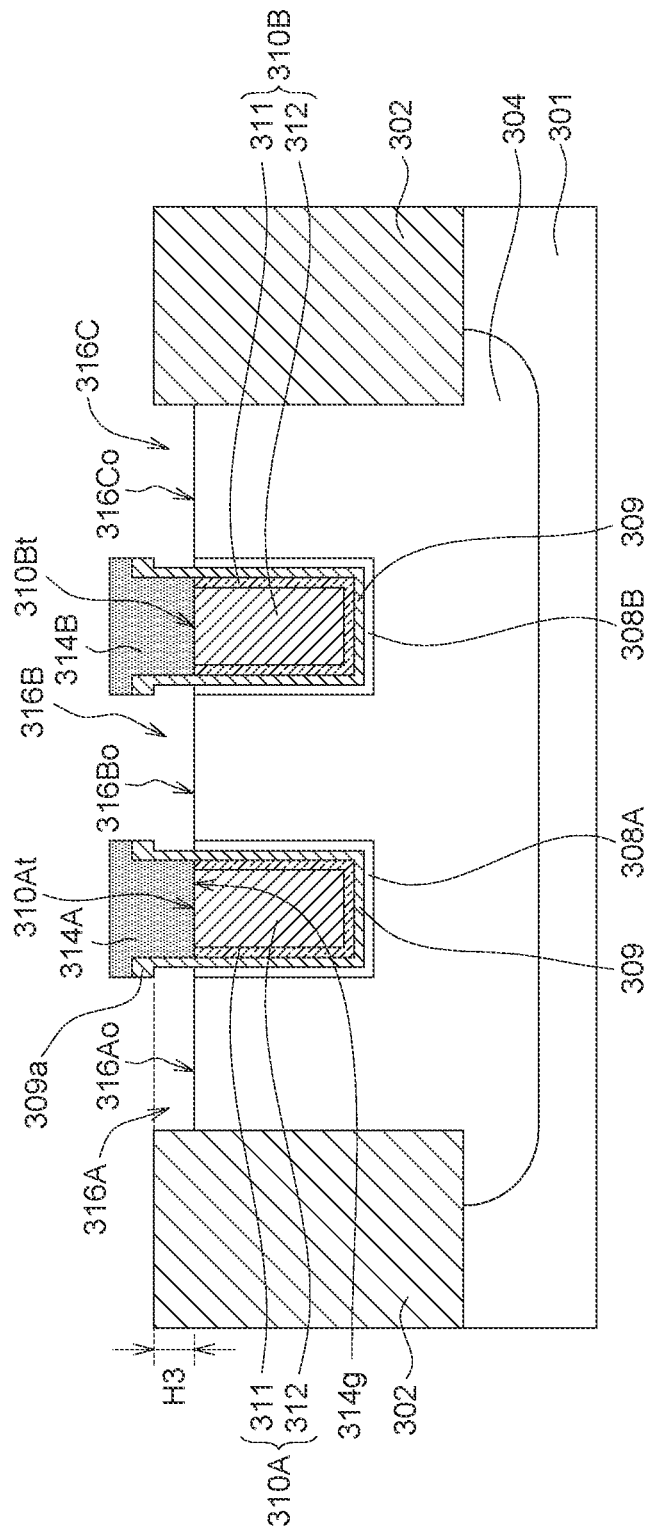
FIG. 3H(2)

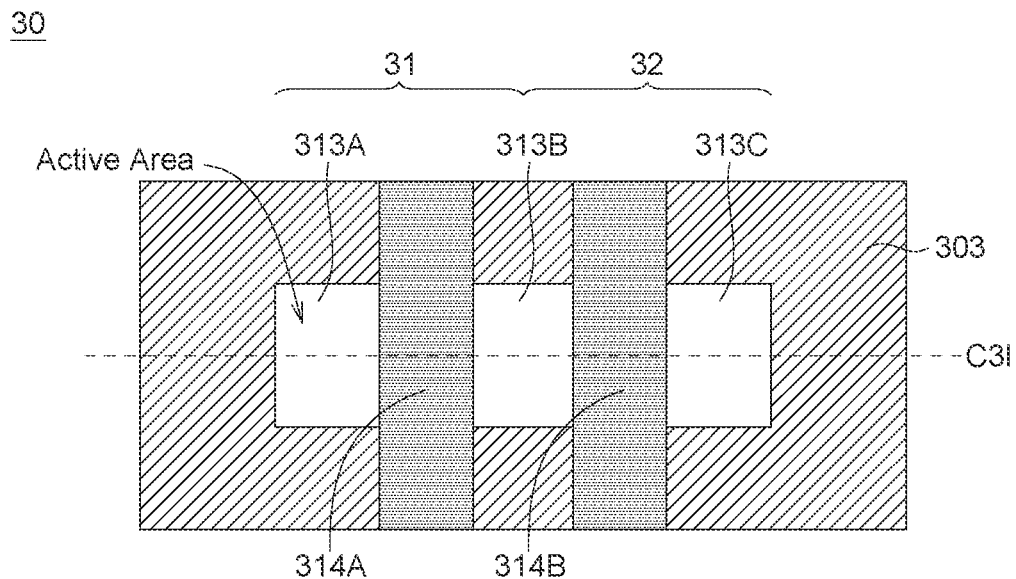
FIG. 3I(1)
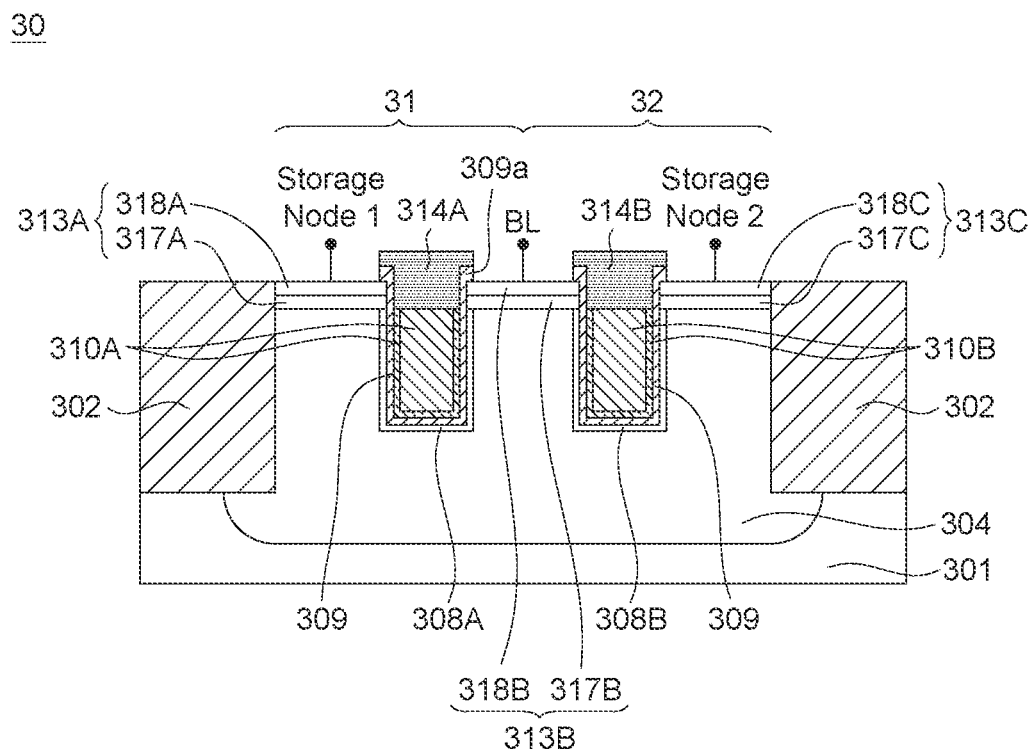
FIG. 3I(2)

TRANSISTOR WITH CONTROLLABLE SOURCE/DRAIN STRUCTURE

This application claims the benefit of U.S. provisional application Ser. No. 63/224,921, filed Jul. 23, 2021, the subject matter of which is incorporated herein by reference.

BACKGROUND

Technical Field

The disclosure relates to a semiconductor device, and more particularly to a U-groove transistor or buried gate transistor with source/drain region aligned or substantially aligned with gate region.

Description of Background

FIG. 1 is a cross section view illustrating a conventional access transistor 100 applied in a buried word line DRAM cell 10. As shown in FIG. 1, part or all of the gate region 101 is located under an original substrate surface 110a of a P-substrate 110. The gate region 101 includes a gate conductive region, a dielectric gate cap 101b disposed over the gate conductive region and a gate oxide layer 105 around or surrounded the gate region. The gate region 101 could comprise either the combination of metal region 101a (such as tungsten (W)) and titanium nitride 101c (TiN), or polysilicon material (not shown). A drain terminal 102 with N+ doped region 102a and a source terminal 103 with a N+ doped region 103a are located on the right hand side and the left hand side of the gate region 101. The drain terminal 102 and the source terminal 103 could further include a lightly doped region (n_LDD) 102b and 103b respectively. One of the drain terminal 102 and the source terminal 103 would be coupled to the capacitor of the DRAM cell (not shown) and the other one is coupled to the bit line BL. Moreover, the channel region of the access transistor (e.g. a vertical NMOS transistor) 100 coupling between the drain terminal 102 and the source terminal 103 will be around or surrounded the gate oxide layer 105.

Due to the fact that the drain terminal 102 and the source terminal 103 are formed by the ion implantation technology, the N+ doped region 102a/103a and the n_LDD region 102b/103b (especially the N+ doping region) of the drain terminal 102 and the source terminal 103 may be partially overlapped with the gate region 101, and will generate a higher electric field and then increases gate Inducing drain leakage (GIDL) current. On the other hand, many lattice damages may be created in the drain terminal 102 and the source terminal 103 by the ion implantation process. Since those lattice damages may be difficult to be fully recovered by a subsequent thermal treatment process, thus source or drain resistance may be increased and higher GIDL current may be further induced, so as to make the access transistor 100 having a worse storage node charges loss and a lower turn on current (ion).

Furthermore, the threshold voltage of access transistor 100 is depending on the implant profile uniformity of a p_well 106 formed in the substrate 110. However, the conventional process adopts multiple implant steps and goes through an annealing process to form the drain terminal 102 and the source terminal 103 in the p_well, the doping profile of the p_well 106 may not be uniform and will inevitably introduce higher threshold voltage variation and increases channel resistance.

Therefore, there is a need of providing an advanced transistor structure to obviate the drawbacks encountered from the prior art.

SUMMARY

One aspect of the present disclosure is to provide a transistor structure, wherein the transistor structure includes a substrate, a gate conductive region, a gate dielectric layer and a first conductive region. At least a portion of the gate conductive region is disposed below an original surface of the substrate. The gate dielectric layer surrounds a bottom wall and sidewalls of the gate conductive region. A bottom wall of the first conductive region is aligned or substantially aligned with a wall of the gate conductive region.

In one embodiment of the present disclosure, the top wall of the first conductive region is aligned or substantially aligned with a top wall of a shallow trench isolator (STI) region next to the first conductive region, but lower than a top wall of a gate cap layer on the gate conductive region.

In one embodiment of the present disclosure, a doping concentration from the bottom wall of the first conductive region to a top wall of the first conductive region is adjustable.

In one embodiment of the present disclosure, the first conductive region with the adjustable doping concentration is independent from the substrate.

In one embodiment of the present disclosure, the substrate is a silicon substrate, and the first conductive region with the adjustable doping concentration is formed by selective epitaxy.

In one embodiment of the present disclosure, the transistor structure further includes a channel layer surrounding the gate dielectric layer, wherein the channel layer is independent from the substrate.

In one embodiment of the present disclosure, the channel layer is a doped silicon layer.

In one embodiment of the present disclosure, the channel layer is a doped silicon-germanium (SiGe) layer.

In one embodiment of the present disclosure, the substrate is a silicon substrate, and the channel layer is formed by selective epitaxy.

In one embodiment of the present disclosure, the gate dielectric layer includes a horizontal extension portion covering a top surface of the first conductive region.

In one embodiment of the present disclosure, a top surface of one terminal of the channel layer is aligned or substantially aligned with the surface of the substrate.

In one embodiment of the present disclosure, the gate conductive region includes a tungsten plug and a TiN layer surrounding the tungsten plug.

In one embodiment of the present disclosure, the transistor structure further includes a channel layer surrounding the gate dielectric layer, wherein the channel layer is a doped layer within the substrate.

Another aspect of the present disclosure is to provide a transistor structure, wherein the transistor structure includes a substrate, a gate conductive region, a gate dielectric layer and a first conductive region. At least a portion of the gate conductive region is disposed below an original surface of the substrate. The gate dielectric layer surrounds a bottom wall and sidewalls of the gate conductive region. The first conductive region is adjacent to the gate conductive region and independent from the substrate; wherein a distance of a vertical gap or a vertical overlap between a bottom wall of the first conductive region and a top wall of the gate conductive region is smaller than 5 nm.

In one embodiment of the present disclosure, a doping concentration from the bottom wall of the first conductive region to a top wall of the first conductive region is vertically adjustable.

In one embodiment of the present disclosure, the substrate is a silicon substrate, and the first conductive region with the adjustable doping concentration is formed by selective epitaxy.

Yet another aspect of the present disclosure is to provide a transistor structure, wherein the transistor structure includes a substrate, a gate conductive region, a gate dielectric layer, a channel layer and a first conductive region. At least a portion of the gate conductive region disposed below an original surface of the substrate. The gate dielectric layer surrounds a bottom wall and sidewalls of the gate conductive region. The channel layer surrounds the gate dielectric layer. The first conductive region is contacted to the channel layer, wherein the channel layer is a composite layer and independent from the substrate.

In one embodiment of the present disclosure, the composite layer includes a high mobility sublayer and a silicon sublayer over the high mobility sublayer. The high mobility sublayer is a doped $Si_{1-x}Ge_x$, $Si_{1-x}C_x$, $Ga_{1-x}As_x$, or $In_{1-x}As_xSb$ layer.

Yet another aspect of the present disclosure is to provide a transistor structure, wherein the transistor structure includes a substrate, a gate conductive region, a gate dielectric layer, and a first conductive region. At least a portion of the gate conductive region disposed below an original surface of the substrate. The gate dielectric layer surrounds a bottom wall and sidewalls of the gate conductive region, wherein a top wall of the first conductive region is lower than a top wall of a shallow trench isolator (STI) region next to the first conductive region, and lower than a top wall of a gate cap layer on the gate conductive region.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 2A(1) is a top view illustrating a partial structure of a semiconductor substrate used for forming NMOS transistor of a buried word line DRAM cell, according to one embodiment of the present disclosure.

FIG. 2A(2) is a cross-sectional view taken along the cutting line C2A as depicted in FIG. 2A(1).

FIG. 2B(1) is a top view illustrating a partial structure after the gate recesses are formed in the semiconductor substrate.

FIG. 2B(2) is a cross-sectional view taken along the cutting line C2B as depicted in FIG. 2B(1).

FIG. 2C(1) is a top view illustrating a partial structure after channel regions are respectively formed in the gate recesses.

FIG. 2C(2) is a cross-sectional view taken along the cutting line C2C as depicted in FIG. 2C(1).

FIG. 2D(1) is a top view illustrating a partial structure after the gate dielectric layer is formed in the gate recesses.

FIG. 2D(2) is a cross-sectional view taken along the cutting line C2D as depicted in FIG. 2D(1).

FIG. 2E(1) is a top view illustrating a partial structure after the gate conductive regions are respectively formed in the gate recesses.

FIG. 2E(2) is a cross-sectional view taken along the cutting line C2E as depicted in FIG. 2E(1).

FIG. 2F(1) is a top view illustrating a partial structure after the dielectric material is formed to fill the top portions of the gate recesses.

FIG. 2F(2) is a cross-sectional view taken along the cutting line C2F as depicted in FIG. 2F(1).

FIG. 2G(1) is a top view illustrating a partial structure after the nitride hard mask layer is removed and the dielectric gate caps are formed on the gate conductive regions.

FIG. 2G(2) is a cross-sectional view taken along the cutting line C2G as depicted in FIG. 2G(1).

FIG. 2H(1) is a top view illustrating a partial structure after a first recess, a second recess and a third recess are formed in the semiconductor substrate.

FIG. 2H(2) is a cross-sectional view taken along the cutting line C2H as depicted in FIG. 2H(1).

FIG. 2I(1) is a top view illustrating a partial structure after a first conductive region, a second conductive region and a third conductive region are respectively formed in the first recess, the second recess and the third recess.

FIG. 2I(2) is a cross-sectional view taken along the cutting line C2I as depicted in FIG. 2I(1).

FIG. 2J(1) is a cross-sectional view for another embodiment of the present invention which is similar to FIG. 2H(2).

FIG. 2J(2) is a cross-sectional view for the another embodiment of the present invention which is similar to FIG. 2I(2).

FIG. 2K(1) is the top view corresponding to FIG. 2J(1) when such process is applied to the DRAM array structure.

FIG. 2K(2) is the top view corresponding to FIG. 2J(2) when such process is applied to the DRAM array structure.

FIG. 3A(1) is a top view illustrating a partial structure of a semiconductor substrate used for forming NMOS transistor of a buried word line DRAM cell, according to one embodiment of the present disclosure.

FIG. 3A(2) is a cross-sectional view taken along the cutting line C3A as depicted in FIG. 3A(1).

FIG. 3B(1) is a top view illustrating a partial structure after the gate recesses are formed in the semiconductor substrate.

FIG. 3B(2) is a cross-sectional view taken along the cutting line C3B as depicted in FIG. 3B(1).

FIG. 3C(1) is a top view illustrating a partial structure after channel regions are respectively formed in the gate recesses.

FIG. 3C(2) is a cross-sectional view taken along the cutting line C3C as depicted in FIG. 3C(1).

FIG. 3D(1) is a top view illustrating a partial structure after the gate dielectric layer is formed in the gate recesses.

FIG. 3D(2) is a cross-sectional view taken along the cutting line C2D as depicted in FIG. 3D(1).

FIG. 3E(1) is a top view illustrating a partial structure after the gate conductive regions are respectively formed in the gate recesses.

FIG. 3E(2) is a cross-sectional view taken along the cutting line C3E as depicted in FIG. 3E(1).

FIG. 3F(1) is a top view illustrating a partial structure after the dielectric material is formed to fill the top portions of the gate recesses.

FIG. 3F(2) is a cross-sectional view taken along the cutting line C3F as depicted in FIG. 3F(1).

FIG. 3G(1) is a top view illustrating a partial structure after the nitride hard mask layer is removed and the dielectric gate caps are formed on the gate conductive regions.

FIG. 3G(2) is a cross-sectional view taken along the cutting line C3G as depicted in FIG. 3G(1).

FIG. 3H(1) is a top view illustrating a partial structure after a first recess, a second recess and a third recess are formed in the semiconductor substrate.

FIG. 3H(2) is a cross-sectional view taken along the cutting line C3H as depicted in FIG. 3H(1).

FIG. 3I(1) is a top view illustrating a partial structure after a first conductive region, a second conductive region and a third conductive region are respectively formed in the first recess, the second recess and the third recess.

FIG. 3I(2) is a cross-sectional view taken along the cutting line C3I as depicted in FIG. 3I(1).

DETAILED DESCRIPTION

Figure 1:
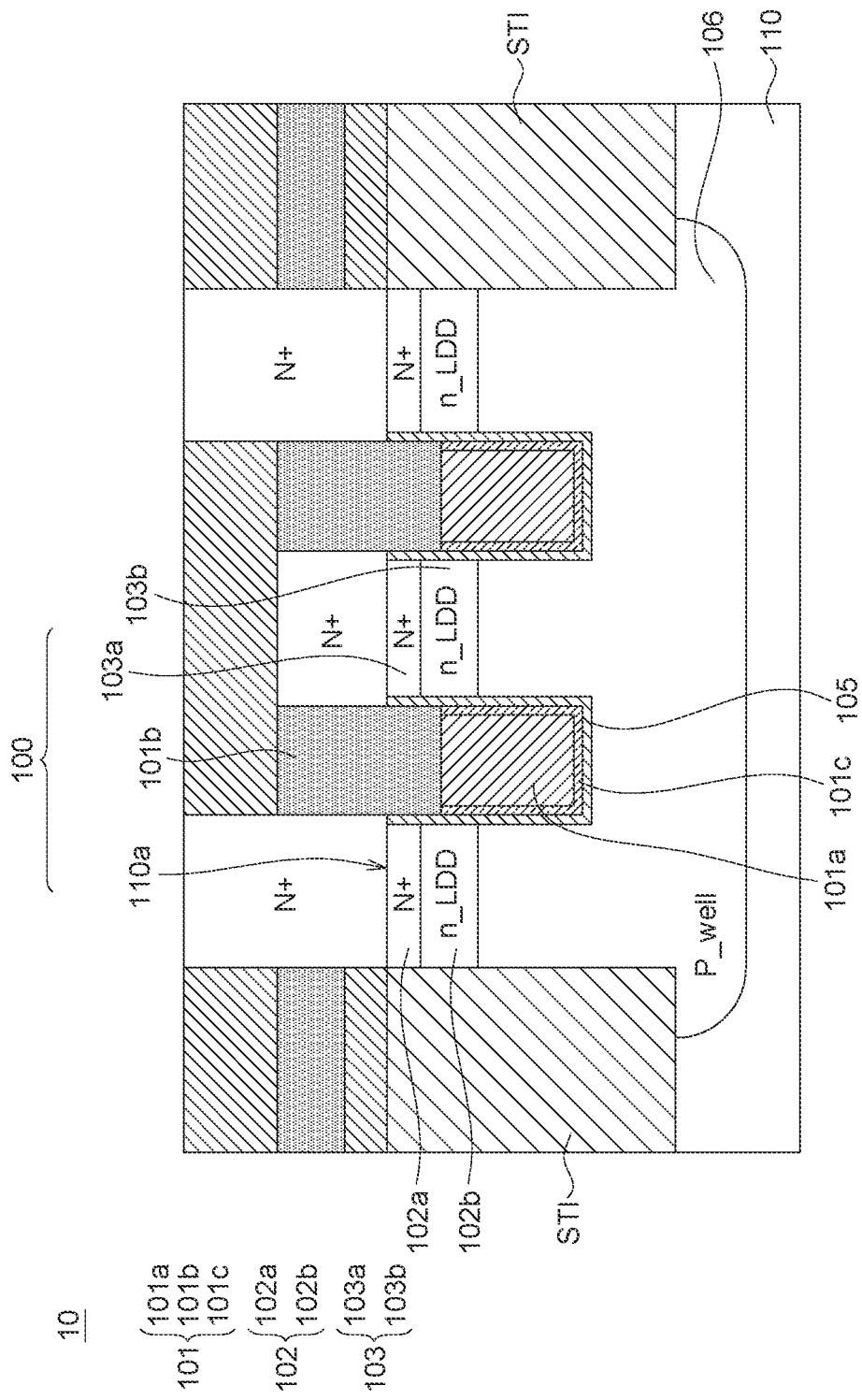
FIG. 1 is a cross section view illustrating a conventional access transistor applied in a buried word line DRAM cell.

The embodiments as illustrated below provide a transistor structure with decreased GIDL current, less threshold voltage variation and lower channel resistance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

The following embodiments are described by forming a transistor structure for a semiconductor device. In some embodiments of the present disclosure, the transistor structure adopted as an example can be (but not limited to) an a U-groove NMOS transistor for used in a buried word line DRAM cell; a structure for a PMOS transistor (not shown) can be derived similarly except which has oppositely doped or formed materials in contrast to those of the NMOS transistor.

Embodiment 1

According to one embodiment of the present disclosure, the method for forming a buried word line DRAM cell 20 having at least one access transistor includes steps as follows:

Step S21: preparing a semiconductor substrate with an original surface;

Step S22: forming a gate conductive region below the original surface of the semiconductor substrate, and the forming of the gate conductive region 210A includes sub-steps S221-S225;

Step S221: use a patterned nitride hard mask layer to form a gate recess in the semiconductor substrate;

Step S222: forming a channel region in the gate recess, wherein the channel layer is a doped layer within the semiconductor substrate (optionally);

Step S223: forming a gate dielectric layer in the gate recess; Step S224: forming the gate conductive region in the gate recess and surrounded by the gate dielectric layer; and Step S225: forming the gate cap region; and Step S23: forming conductive regions, wherein a bottom wall of a first conductive region is aligned or substantially aligned with a top wall of the gate conductive region. The forming of the conductive regions includes sub-steps S231-S233:

Step S231: revealing the original surface of the substrate;

Step S232: etching the revealed semiconductor substrate to form recesses for the conductive regions; and Step S233: forming the conductive regions by a selective growth method (e.g., a selective epitaxy growth (SEG) method or an atomic layer deposition (ALD) method).

Referring to Step S221: preparing a semiconductor substrate 201 with an original surface 201a. FIG. 2A(1) is a top view illustrating a partial structure of the semiconductor substrate 201 used for forming the NMOS transistors of the buried word line DRAM cells, according to one embodiment of the present disclosure. FIG. 2A(2) is a cross-sectional view taken along the cutting line C2A as depicted in FIG. 2A(1).

In the present embodiment, the semiconductor substrate 201 includes a silicon layer, such as a poly-silicon layer or an amorphous silicon layer. As shown in FIGS. 2A(1) and 2A(2), at least one shallow trench isolator (STI) 202 is then formed in the semiconductor substrate 201 to define an active area for forming the NMOS transistors, such that the active area is surrounded by the STI 202. A pad oxide layer 203 is formed on the STI 202 and the original surface 201a of the semiconductor substrate 201, wherein the pad oxide layer 203 may include silicon oxide, silicon oxynitride or the combination thereof. Then, use deep n_well implantation, p_well implantation, threshold implantation and thermal annealing process to form DRAM array cell well profile (including a p_well 204 in the semiconductor substrate 201).

Referring to Step S22: forming a gate conductive region 210A below the original surface 201a of the semiconductor substrate 201, the forming of the gate conductive region 210A includes sub-steps S221-S225 described as follows:

Referring to Step S221: patterning a nitride hard mask layer 206 and removing the unwanted material to form gate recesses (such as, the gate recesses 207A and 207B) in the semiconductor substrate 201, wherein FIG. 2B(1) is a top view illustrating a partial structure after the gate recesses 207A and 207B are formed in the semiconductor substrate 201, and FIG. 2B(2) is a cross-sectional view taken along the cutting line C2B as depicted in FIG. 2B(1).

The forming of the gate recesses 207A and 207B includes steps as follows: Firstly, a patterned nitride hard mask layer 206 having at least one opening is formed on the pad oxide layer 203, and at least one etching process using the patterned nitride hard mask layer 206 as an etching mask is performed to remove portions of the pad oxide layer 203 and portions of the semiconductor substrate 201, so as to form the gate recesses 207A and 207B within the active area.

Alternatively, a signal photo-resist patterning (etching) process is performed to remove portions of the nitride hard mask layer 206, portions of the pad oxide layer 203 and portions of the semiconductor substrate 201, so as to define the gate recesses 207A and 207B within the active area.

Referring to Step S222: forming a channel region (such as the channel region 208A) in the gate recess (such as, the gate recess 207A), wherein the channel layer 208A is a doped layer formed within the semiconductor substrate 201. In the present embodiment, the forming of the channel regions 208A and 208B includes steps as follows: Firstly, as shown in FIG. 2C(1) which is a top view and FIG. 2C(2) which is a cross-sectional view taken along the cutting line C2C as depicted in FIG. 2C(1), a p-type doped polysilicon plug 208P is formed to fill the gate recesses 207A and 207B; and a thermal annealing process is then performed to drive the p-type dopants (e.g., Boron) originally doped in the p-type doped polysilicon plug 208P penetrating through the bottom wall 207Ao and 207Bo as well as the sidewalls 207As and 207Bs of the gate recesses 207A and 207B, so as to form a doped channel regions 208A and 208B within the semiconductor substrate 201.

Referring to Step S223: forming a gate dielectric layer 209 in the gate recess 207A and 207B. FIG. 2D(1) is a top view illustrating a partial structure after the gate dielectric layer 209 is formed in the gate recesses 207A and 207B, and FIG. 2D(2) is a cross-sectional view taken along the cutting line C2D as depicted in FIG. 2D(1). In the present embodiment, the forming of the gate dielectric layer 209 includes steps as follows: Firstly, the p-type doped polysilicon plug 208P filled in the gate recesses 207A and 207B is removed by an etching process; and then a thermal oxidation process is performed to growth thermal gate dielectric material on the bottom wall 207Ao and 207Bo as well as the sidewalls 207As and 207Bs of the gate recesses 207A and 207B. Thereby, the gate dielectric layer 209 made of the thermal gate dielectric material can protect the p-type doped silicon channel layer not to be exposed to outside environment or contamination issue.

Alternatively, in some other embodiments, the gate dielectric layer 209 can be a dielectric layer (e.g., including silicon dioxide or high-k dielectric material) formed on the bottom wall 207Ao and 207Bo as well as the sidewalls 207As and 207Bs of the gate recesses 207A and 207B by a deposition process (e.g., a low pressure chemical vapor deposition (LPCVD)).

Referring to Step S224: forming a gate region in the gate recess (such as 207A or 207B) and surrounded by the gate dielectric layer 209. FIG. 2E (1) is a top view illustrating a partial structure after the gate conductive regions 210A and 210B are respectively formed in the gate recesses 207A and 207B, and FIG. 2E(2) is a cross-sectional view taken along the cutting line C2E as depicted in FIG. 2E(1). In the present embodiment, the forming of the gate conductive regions 210A and 210B includes steps as follows: Firstly, a TiN film 211 is formed on the gate dielectric layer 209 in the gate recesses 207A and 207B by a deposition process (e.g., an atomic layer deposition (ALD) process) and the remaining parts of the gate recesses 207A and 207B are filled with tungsten 212. Subsequently, an etching back process is performed to remove the portions of the TiN film 211 and the tungsten 212 disposed in the gate recesses 207A and 207B, so as to make the top of the remaining TiN film 211 and the tungsten 212 below the original surface 201a of the semiconductor substrate 201.

Whereby, the remaining portions of the TiN film 211 and the tungsten 212 that are in the gate recesses 207A and 207B, below the original surface 201a of the semiconductor substrate 201, and surrounded by the gate dielectric layer 209, can be combined to serve as the gate conductive regions 210A and 210B respectively.

Referring to step S225: forming the gate cap region. Afterward, gate cap material 214 (such as, nitride) is filled into the gate recesses 207A and 207B respectively to protect the gate conductive regions 210A and 210B. In the present embodiment, the gate cap material 214 is formed by depositing nitride to fill the top portions of the gate recesses 207A and 207B, and planarizing (such as, using a CMP technology) the deposited gate cap 214 using the nitride hard mask layer 206 as a stop layer, wherein FIG. 2F(1) is a top view illustrating a partial structure after the dielectric material 214 is formed to fill the top portions of the gate recesses 207A and 207B; and FIG. 2F(2) is a cross-sectional view taken along the cutting line C2F as depicted in FIG. 2F(1).

Now referring to Step S23: forming conductive regions, wherein a bottom wall of the conductive region is aligned or substantially aligned with a top wall of the gate conductive region. The forming of the conductive regions includes sub-steps of S231-S234 described as follows:

Referring to Step S231: revealing the original surface of the substrate. Subsequently, the nitride hard mask layer 206, portions of the dielectric material 214 and the pad oxide layer 203 are etched or removed for revealing the STI 202 and the active area region (or the original surface of the substrate), and the remaining dielectric gate caps 214A and 214B are still on the top of gate conductive regions 210A and 210B to protect the gate conductive regions 210A and 210B from being exposed to the environment. Wherein FIG. 2G(1) is a top view illustrating a partial structure after the original surface of the substrate is revealed; and FIG. 2G(2) is a cross-sectional view taken along the cutting line C2G as depicted in FIG. 2G(1).

Referring to Step S232: etching the semiconductor substrate 201 to form recesses (including the first recess 216A) for the conductive regions, wherein FIG. 2H(1) is a top view illustrating a partial structure after a first recess 216A, a second recess 216B and a third recess 216C are formed in the semiconductor substrate 201; and FIG. 2H(2) is a cross-sectional view taken along the cutting line C2H as depicted in FIG. 2H(1).

In the present embodiment, an etching process using the combination of the STI, the gate dielectric layer 209 and the dielectric gate caps 214A and 214B as an etching mask is performed to remove the exposed portions of the semiconductor substrate 201 in the active area (including the top portions of the channel regions 208A and 208B) to form the first recess 216A, the second recess 216B and the third recess 216C. Wherein the first recess 216A and the second recess 216B are formed on two opposite sides of the dielectric gate cap 214A; the second recess 216B and the third recess 216C are formed on two opposite sides of the dielectric gate cap 214B.

Of note that the etching process for forming the first recess 216A, the second recess 216B and the third recess 216C should stop at a proper recess depth H2 to make the bottom surfaces 216Ao and 216Bo of the first recess 216A and the second recess 216B aligned or substantially aligned with the top wall 210At of the gate conductive region 210A, and to make the bottom surfaces 216Bo and 216Co of the second recess 216B and the third recess 216C aligned or substantially aligned with the top wall 210Bt of the gate conductive region 210B.

For example, the proper recess depth H2 can be well controlled through taking account of different etching rates selectivity for the semiconductor substrate 201 of silicon, the STI oxide 202 and the dielectric gate caps 214A and 214B of nitride. In some embodiments of the present disclosure, the proper recess depth H2 can be about 50 nm, and the bottom surface 216Ao, 216Bo and 216Co of the first recess 216A, the second recess 216B and the third recess 216C can be aligned to the bottom edges of the dielectric gate caps 214A and 214B. Moreover, as shown in FIG. 2H(2), the top surface of one terminal of the channel layer 208A or 208B is aligned or substantially aligned with the surface of the substrate (e.g., the surface 216Ao, 216Bo or 216Co).

Referring to Step S233: forming conductive regions by a selective growth method, wherein FIG. 2I(1) is a top view illustrating a partial structure after a first conductive region 213A, a second conductive region 213B and a third conductive region 213C are respectively formed in the first recess 216A, the second recess 216B and the third recess 216C; and FIG. 2I(2) is a cross-sectional view taken along the cutting line C2I as depicted in FIG. 2I(1).

The forming of the first conductive region 213A, the second conductive region 213B and the third conductive region 213C includes steps as follows: Firstly, a silicon selective growth process, such as a SEG process or an ALD process, is performed to form n-type lightly doped (n_LDD) regions 217A, 217B and 217C on the portions of the semiconductor 201 exposed from the first recess 216A, the second recess 216B and the third recess 216C respectively. Another silicon selective growth process (e.g., a SEG process or an ALD process) is then performed to form the heavy doped (N+) regions 218A, 218B and 218C on the n_LDD regions 217A, 217B and 217C respectively. Subsequently, an optional rapid thermal annealing (RTA) process is performed to enhance activation doping concentration of the n_LDD regions 217A, 217B and 217C and the heavy doped (N+) regions 218A, 218B and 218C. In one embodiment, each of the heavy doped (N+) regions 218A, 218B and 218C has a top surface aligned or substantially aligned with the top of the remaining STI oxide 202. As shown in FIG. 2I(2), the top wall of the first conductive region 213A is aligned or substantially aligned with a top wall of a shallow trench isolator (STI) region 202 next to the first conductive region 213A, but lower than a top wall of a gate cap layer 214A on the gate conductive region.

Due to the etching processes, in another embodiment, a distance of a vertical gap (when a bottom wall of the first conductive region 213A is higher than a top wall of the gate conductive region 210A) or a vertical overlap (when the bottom wall of the first conductive region 213A is lower than a top wall of the gate conductive region 210A) between the bottom wall of the first conductive region 213A and the top wall of the gate conductive region 210A is within a predetermined range, such as smaller than 3-5 nm.

Wherein the heavy doped (N+) regions 218A and the n_LDD regions 217A together form the first conductive region 213A; the heavy doped (N+) regions 218B and the n_LDD regions 217B together form the second conductive region 213B; and the heavy doped (N+) regions 218C and the n_LDD regions 217C together form the third conductive region 213C. By using the silicon selective growth technology to form the first conductive region 213A, the doping concentration profile from the bottom walls to the top wall of the first conductive region 213A can be adjustable. Similarly, the doping concentration profiles of the second conductive region 213B and the third conductive region 213C can be also adjustable.

The first conductive region 213A, the second conductive region 213B, the channel regions 208A, the gate conductive regions 210A and the gate dielectric layer 209 together can form the NMOS transistor 21. The third conductive region 213C, the second conductive region 213B, the channel regions 208B, the gate conductive regions 210B and the gate dielectric layer 209 together can form the NMOS transistor 22. The first conductive region 213A and the second conductive region 213B can respectively serve as the source and drain of the NMOS transistor 21. The third conductive region 213C and the second conductive region 213B can respectively serve as the source and drain of the NMOS transistor 22.

After a series steps of down-stream process are performed, the forming of the buried word line DRAM cell 20 can be implemented. Wherein the first conductive region 213A, the second conductive region 213B and the third conductive region 213C can be respectively connected to the storage node-1, the bit line BL and the storage node-2 of the buried word line DRAM cell 20 (as shown in FIG. 2I(2)).

In sum, because of taking into account the different etching selectivity for silicon, oxide and nitride (as shown in FIGS. 2H(1) and 2H(2)), it can provide better etching control of the silicon recess (such as, the first recess 216A, the second recess 216B and the third recess 216C) in which the source or drain of the NMOS transistors 21 and 22 is formed. Thus, the bottom level of the source/drain can be controlled to be aligned or substantially aligned with the bottom of the dielectric gate cap (or with the top walls of the gate conductive regions), and the GIDL current caused by the gate-source/drain overlapping can thus be reduced.

Moreover, since the N+ regions and the n_LDD regions of the new designed source or drain are formed by silicon selective epitaxy growth technology (as shown in FIGS. 2I(1) and 2I(2)), thus the lattice damages in the source or drain caused by the ion implantation process can be avoided. At the storage node side, compares to conventional design, new designed N+ regions of the present disclosure that are formed by silicon selective growth technology and have higher activation doping concentration and lower resistance. Therefore, this design of the present disclosure can improve turn on current of the NMOS transistors 21 and 22 than that of the conventional cell access transistor. For the channel of the NMOS transistors 21 and 22, it uses p-type doped polysilicon plus thermal drive-in technology (as shown in FIGS. 2C(1) and 2C(2)). It can improve channel doping uniformity and reduces threshold voltage variation of the NMOS transistors 21 and 22.

In addition, the optimal RTA process form forming the first conductive region 213A, the second conductive region 213B and the third conductive region 213C can also perform a drive-in process to achieve the n_LDD regions 217A, 217B and 217C to gate overlap and reduces the source or drain resistance of the NMOS transistors 21 and 22.

To avoid the storage node (the first conductive region 213A or the third conductive region 213C) being short with the BL (the second conductive region 213B), in another embodiment shown in FIG. 2J(1) which is similar to FIG. 2H(2), the top surface of the remaining shallow trench isolator (STI) 202 could be a little bit lower than the top surface of the remaining dielectric gate caps 214A and 214B based on suitable etching solution. FIG. 2K(1) is the top view corresponding to FIG. 2J(1) when such process is applied to the DRAM array structure, in which a plurality of structures in FIG. 2J(1) are reproduced in the DRAM array.

Then as shown in FIG. 2J(2) which is similar to FIG. 2I(2), the first conductive region 213A, the second conductive region 213B and the third conductive region 213C are selectively grown in the first recess 216A, the second recess 216B and the third recess 216C based on the revealed Si in the active region. However, the top surfaces of the first conductive region 213A, the second conductive region 213B and the third conductive region 213C are lower than those of the remaining STI 202, the remaining dielectric gate caps 214A and 214B, such that the storage Node 1 or the storage Node 2 will not be short with BL. FIG. 2K(2) is the top view corresponding to FIG. 2J(2) when such process is applied to the DRAM array structure, in which a plurality of structures in FIG. 2J(2) are reproduced in the DRAM array. As shown in FIG. 2J(2), the top wall of the first conductive region 213A is lower than a top wall of a shallow trench isolator (STI) region 202 next to the first conductive region 213A, and lower than a top wall of a gate cap layer 214A on the gate conductive region as well.

Embodiment 2

According to one embodiment of the present disclosure, the method for forming a buried word line DRAM cell 30 having at least one (such as, NMOS transistors 31 and 32) includes steps as follows:

Step S31: preparing a semiconductor substrate with an original surface;

Step S32: forming a gate conductive region below the original surface of the semiconductor substrate, and the forming of the gate conductive region 210A includes sub-steps S321-S325;

Step S321: using a patterned nitride hard mask layer to form a gate recess in the semiconductor substrate;

Step S322: forming a channel region in the gate recess, wherein the channel layer is independent from the semiconductor substrate (optionally);

Step S323: forming a gate dielectric layer in the gate recess;

Step S324: forming the gate conductive region in the gate recess and surrounded by the gate dielectric layer; and Step S325: forming the gate cap region; and Step S33: forming conductive regions, wherein a bottom wall of a first conductive region is aligned or substantially aligned with a top wall of the gate conductive region. The forming of the conductive regions includes sub-steps S331-S333:

Step S331: revealing the original surface of the substrate;

Step S332: etching the revealed semiconductor substrate to form recesses for the conductive regions; and Step S333: forming the first conductive region by a selective growth method (e.g., a selective epitaxy growth (SEG) method or an atomic layer deposition (ALD) method).

Referring to Step S31: preparing a semiconductor substrate 301 with an original surface 301a. As show in FIG. 3A(1) which is a top view and FIG. 3A(2) which is a cross-sectional view taken along the cutting line C3A as depicted in FIG. 3A(1), the semiconductor substrate 301 includes a silicon layer, such as a poly-silicon layer or an amorphous silicon layer. Shallow trench isolator (STI) 302 is formed in the semiconductor substrate 301 to define an active area for forming the NMOS transistors; a pad oxide layer 303 is formed on the STI 302 and the original surface 301a of the semiconductor substrate 301, such that the active area surrounded by the STI 302. Then, use deep n_well implantation, p_well implantation, threshold implantation and thermal annealing process to form DRAM array cell well profile (including a p_well 304 in the semiconductor substrate 301). The pad oxide layer 303 may include silicon oxide, silicon oxynitride or the combination thereof.

Referring to Step S32: forming a gate conductive region 310A below the original surface 301a of the semiconductor substrate 301, the forming of the gate conductive region 310A includes sub-steps S321-S324 described as follows:

Referring to Step S321: patterning a nitride hard mask layer 306 and removing the unwanted material to form gate recesses (such as, the gate recesses 307A and 307B) in the semiconductor substrate 301, wherein FIG. 3B(1) is a top view illustrating a partial structure after the gate recesses 307A and 307B are formed in the semiconductor substrate 301. FIG. 3B(2) is a cross-sectional view taken along the cutting line C3B as depicted in FIG. 3B(1).

The forming of the gate recesses 307A and 307B includes steps as follows: Firstly, a patterned nitride hard mask layer 306 having at least one opening is formed on the pad oxide layer 303, and at least one etching process using the patterned nitride hard mask layer 306 as an etching mask is performed to remove portions of the pad oxide layer 303 and portions of the semiconductor substrate 301 to form the gate recesses 307A and 307B.

Alternatively, a signal photo-resist patterning (etching) process is performed to remove portions of the nitride hard mask layer 306, portions of the pad oxide layer 303 and portions of the semiconductor substrate 301, so as to define the gate recesses 307A and 307B within the active area.

Referring to Step S322: forming a channel region (such as the channel region 308A) in the gate recess (such as, the gate recess 307A), wherein the channel layer 308A is independent from the semiconductor substrate 301. FIG. 3C(1) is a top view illustrating a partial structure after the channel regions 308A and 308B are respectively formed in the gate recesses 307A and 307B. FIG. 3C(2) is a cross-sectional view taken along the cutting line C3C as depicted in FIG. 3C(1).

In the present embodiment, the forming of the channel regions 308A and 308B includes performing a process selective growth process (e.g., a SEG process or an ALD process) to respectively form a p-type doped polysilicon layer, a silicon-germanium ($Si_{1-x}Ge_x$) layer on the bottom wall 307Ao and 307Bo as well as on the sidewalls 307As and 307Bs of the gate recesses 307A and 307B. Wherein each of the channel region 308A and 308B can be a deposited layer extending into the gate recess 307A or the gate recess 307B from the semiconductor substrate 301 independently. Moreover, such selective grown channel layer can improve channel doping uniformity, and the selective grown channel layer formed by selective epitaxy growth (SEG) p-type doped SixGe1-x or another high mobility materials can reduce channel resistance and improve turn on current. In another embodiment, the channel region could comprise a composite selectively grown layer which may include a high mobility sublayer (such as, SixGe1-x, silicon carbide ($Si_{1-x}C_x$), Gallium-arsenide ($Ga_{1-x}As_x$) or Indium-arsenide-Antimony ($In_{1-x}As_xSb$)) on the bottom wall 307Ao and 307Bo as well as on the sidewalls 307As and 307Bs of the gate recesses 307A and 307B, and a Si sublayer over the high mobility sublayer. The selectively grown Si sublayer is a cap layer between the high mobility sublayer and the gate oxide for interface traps reduction.

Referring to Step S323: forming a gate dielectric layer 309 in the gate recess 307A and 307B. FIG. 3D(1) is a top view illustrating a partial structure after the gate dielectric layer 309 is formed in the gate recesses 307A and 307B. FIG. 3D(2) is a cross-sectional view taken along the cutting line C3D as depicted in FIG. 3D(1). The forming of the gate dielectric layer 309 includes steps as follows: Firstly, a thermal oxidation process is performed to growth thermal gate dielectric material on the channel regions 308A and 308B in the gate recesses 307A and 307B. Thereby, the gate dielectric layer 309 made of the thermal gate dielectric material can protect the p-type doped silicon layer or the $Si_{1-x}Ge_x$ layer not to be exposed to outside environment or contamination issue.

Alternatively, in some other embodiments, the gate dielectric layer 309 can be a dielectric layer (e.g., including silicon dioxide or high-k dielectric material) formed on the channel regions 308A and 308B by a deposition process (e.g., a low pressure chemical vapor deposition (LPCVD)).

Of note that, the gate dielectric layer 309 may include a horizontal extension portion 309a covering a top surface 308t of the channel regions 308A and 308B.

Referring to Step S324: forming a gate region in the gate recess 307A and surrounded by the gate dielectric layer 309. FIG. 3E (1) is a top view illustrating a partial structure after the gate conductive regions 310A and 310B are respectively formed in the gate recesses 307A and 307B. FIG. 3E(2) is a cross-sectional view taken along the cutting line C3E as depicted in FIG. 3E(1). In the present embodiment, the forming of the gate conductive regions 310A and 310B includes steps as follows: Firstly, a TiN film 311 is formed on the gate dielectric layer 309 in the gate recesses 307A and 307B by a deposition process (e.g., an atomic layer deposition (ALD) process) and the remaining parts of the gate recesses 307A and 307B are filled with tungsten 312. Subsequently, an etching back process is performed to remove the portions of the TiN film 311 and the tungsten 312 disposed in the gate recesses 307A and 307B, so as to make the top of the remaining TiN film 311 and the tungsten 312 below the original surface 301a of the semiconductor substrate 301.

Whereby, the remaining portions of the TiN film 311 and the tungsten 312 that are in the gate recesses 307A and 307B, below the original surface 301a of the semiconductor substrate 301, and surrounded by the gate dielectric layer 309, can be combined to serve as the gate conductive regions 310A and 310B respectively.

Referring to step S325: forming the gate cap region. Afterward, gate cap material 314 (such as, nitride) is filled into the gate recesses 307A and 307B respectively to protect the gate conductive regions 310A and 310B. In the present embodiment, the gate cap material 314 is formed by depositing nitride to fill the top portions of the gate recesses 307A and 307B, and planarizing (such as, using a CMP technology) the deposited gate cap material 314 using the nitride hard mask layer 306 as a stop layer, wherein FIG. 3F(1) is a top view illustrating a partial structure after the dielectric material 314 is formed to fill in the gate recesses 307A and 307B; and FIG. 3F(2) is a cross-sectional view taken along the cutting line C3F as depicted in FIG. 3F(1).

Now referring to Step S33: forming conductive regions, wherein a bottom wall of the conductive region is aligned or substantially aligned with a top wall of the gate conductive region. The forming of the conductive regions includes sub-steps of S331-S334 described as follows:

Referring to Step S331: revealing the original surface of the substrate. Subsequently, the nitride hard mask layer 306, portions of the dielectric material 314 and the pad oxide layer 303 are etched or removed for revealing the STI 302 and the active area region (or the original surface of the substrate), and the remaining dielectric gate caps 314A and 314B are still on the top of gate conductive regions 310A and 310B to protect the gate conductive regions 310A and 310B from being exposed to the environment. Wherein FIG. 3G(1) is a top view illustrating a partial structure after the original surface of the substrate is revealed; and FIG. 3G(2) is a cross-sectional view taken along the cutting line C3G as depicted in FIG. 3G(1).

Referring to Step S332: etching the semiconductor substrate 301 to form recesses (including the first recess 316A), wherein FIG. 3H(1) is a top view illustrating a partial structure after a first recess 316A, a second recess 316B and a third recess 316C are formed in the semiconductor substrate 301; and FIG. 3H(2) is a cross-sectional view taken along the cutting line C3H as depicted in FIG. 3H(1).

In the present embodiment, an etching process using the combination of the STI 302, the gate dielectric layer 309 and the dielectric gate caps 314A and 314B as an etching mask is performed to remove the exposed portions of the semiconductor substrate 301 in the active area (including the top portions of the channel regions 308A and 308B) to form the first recess 316A, the second recess 316B and the third recess 316C. Wherein the first recess 316A and the second recess 316B are formed on two opposite sides of the dielectric gate cap 314A; the second recess 316B and the third recess 316C are formed on two opposite sides of the dielectric gate cap 314B.

Of note that the etching process for forming the first recess 316A, the second recess 316B and the third recess 316C should stop at a proper recess depth H3 to make the bottoms 316Ao and 316Bo of the first recess 316A and the second recess 316B aligned or substantially aligned with the top wall 310At of the gate conductive region 310A, and to make the bottoms 316Bo and 316Co of the second recess 316B and the third recess 316C aligned or substantially aligned with the top wall 310Bt of the gate conductive region 310B.

For example, the proper recess depth H3 can be well controlled through taking account of different etching rates selectivity for the semiconductor substrate 301 of silicon, the STI oxide 303 and the dielectric gate caps 314A and 314B of nitride. In some embodiments of the present disclosure, the proper recess depth H3 can be about 50 nm, and the bottoms 316Ao, 316Bo and 316Co of the first recess 316A, the second recess 316B and the third recess 316C can be aligned to the bottom edges of the dielectric gate caps 314A and 314B. Moreover, as shown in FIG. 3H(2), the top surface of one terminal of the channel layer 308A or 308B is aligned or substantially aligned with the surface of the substrate (e.g., the surface 316Ao, 316Bo or 316Co).

Referring to Step S333: forming the first conductive region 313A by a selective growth method, wherein FIG. 3I(1) is a top view illustrating a partial structure after a first conductive region 313A, a second conductive region 313B and a third conductive region 313C are respectively formed in the first recess 316A, the second recess 316B and the third recess 316C; and FIG. 3I(2) is a cross-sectional view taken along the cutting line C3I as depicted in FIG. 3I(1).

The forming of the first conductive region 313A, the second conductive region 313B and the third conductive region 313C includes steps as follows: Firstly, a silicon selective growth process, such as a SEG process or an ALD process, is performed to form n-type lightly doped (n_LDD) regions 317A, 317B and 317C on the portions of the semiconductor 301 exposed from the first recess 316A, the second recess 316B and the third recess 316C. Another silicon selective growth process (e.g., a SEG process or an ALD process) is then performed to form the heavy doped (N+) regions 318A, 318B and 318C on the n_LDD regions 317A, 317B and 317C respectively. Subsequently, an optional rapid thermal annealing (RTA) process is performed to enhance activation doping concentration of the n_LDD regions 317A, 317B and 317C and the heavy doped (N+) regions 318A, 318B and 318C. In one embodiment, each of the heavy doped (N+) regions 318A, 318B and 318C has a top surface aligned or substantially aligned with the top of the remaining STI oxide 302.

Wherein, the heavy doped (N+) regions 318A and the n_LDD regions 317A together form the first conductive region 313A; the heavy doped (N+) regions 318B and the n_LDD regions 317B together form the second conductive region 313B; and the heavy doped (N+) regions 318C and the n_LDD regions 317C together form the third conductive region 313C. By using the silicon selective growth technology to form the first conductive region 313A, the doping concentration profile from the bottom walls to the top wall of the first conductive region 313A can be adjustable. Similarly, the doping concentration profiles of the second conductive region 313B and the third conductive region 313C can be also adjustable.

The first conductive region 313A, the second conductive region 313B, the channel regions 308A, the gate conductive regions 310A and the gate dielectric layer 309 together can form the NMOS transistor 31. The third conductive region 313C, the second conductive region 313B, the channel regions 308, the gate conductive regions 310B and the gate dielectric layer 309 together can form the NMOS transistor 32. The first conductive region 313A and the second conductive region 313B can respectively serve as the source and drain of the NMOS transistor 31. The third conductive region 313C and the second conductive region 313B can respectively serve as the source and drain of the NMOS transistor 32.

After a series steps of down-stream process are performed, the forming of the buried word line DRAM cell 30 can be implemented. Wherein the first conductive region 313A, the second conductive region 313B and the third conductive region 313C can be respectively connected to the storage node-1, the bit line BL and the storage node-2 of the buried word line DRAM cell 30 (as shown in FIG. 3I(2)).

As previously mentioned, because of taking into account the different etching selectivity for silicon, oxide and nitride (as shown in FIGS. 3H(1) and 3H(2)), it can provide better etching control of the silicon recess (such as, the first recess 316A, the second recess 316B and the third recess 316C) in which the source or drain of the NMOS transistors 31 and 32 is formed. Thus, the bottom level of the source/drain can be controlled to be aligned or substantially aligned with the bottom of the dielectric gate cap (or with the top walls of the gate conductive regions), and the GIDL current caused by the gate-source/drain overlapping can thus be reduced.

Moreover, since the N+ regions and the n_LDD regions of the new designed source or drain are formed by silicon selective epitaxy growth technology (as shown in FIGS. 3I(1) and 3I(2)), thus the lattice damages in the source or drain caused by the ion implantation process can be avoided. At the storage node side, compares to conventional design, new designed N+ regions of the present disclosure that are formed by silicon selective growth technology and have higher activation doping concentration and lower resistance. Therefore, this design of the present disclosure can improve turn on current of the NMOS transistors 31 and 32 than that of the conventional cell access transistor. For the channel of the NMOS transistors 31 and 32, it uses SEG doped p-type polysilicon (as shown in FIGS. 3C(1) and 3C(2)) to improve channel doping uniformity and reduces threshold voltage variation of the NMOS transistors 31 and 32.

Furthermore, as shown in FIG. 3I(2), the gate dielectric layer 309 (thermal oxide) includes a horizontal extension portion 309a covering a top surface of the drain/source regions, such that the drain/source regions are separate from the nitride dielectric gate caps 314A and 314B to further reduce GIDL issue.

In addition, the optimal RTA process form forming the first conductive region 313A, the second conductive region 313B and the third conductive region 313C can also perform a drive-in process to achieve the n_LDD regions 317A, 317B and 317C to gate overlap and reduces the source or drain resistance of the NMOS transistors 31 and 32.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A transistor structure comprising:
a substrate;
a gate conductive region, at least a portion of the gate conductive region disposed below a surface of the substrate;
a gate dielectric layer surrounding a bottom wall and sidewalls of the gate conductive region; and
a first conductive region;
wherein a bottom wall of the first conductive region is aligned with a top wall of the gate conductive region, and the first conductive region includes an epitaxial semiconductor layer extending upward from the bottom wall of the first conductive region.

2. The transistor structure according to claim 1, wherein the top wall of the first conductive region is aligned or substantially aligned with a top wall of a shallow trench isolator (STI) region next to the first conductive region, but lower than a top wall of a gate cap layer on the gate conductive region.

3. The transistor structure according to claim 1, wherein a doping concentration from the bottom wall of the first conductive region to a top wall of the first conductive region is adjustable.

4. The transistor structure according to claim 3, wherein the first conductive region with the adjustable doping concentration is independent from the substrate.

5. The transistor structure according to claim 4, wherein the substrate is a silicon substrate, and the first conductive region with the adjustable doping concentration is formed by a selective growth process.

6. The transistor structure according to claim 1, further comprising a channel layer surrounding the gate dielectric layer, wherein the channel layer is independent from the substrate.

7. The transistor structure according to claim 6, wherein the channel layer is a doped silicon layer.

8. The transistor structure according to claim 6, wherein the channel layer is a doped silicon-germanium ($Si_{1-x}Ge_x$) layer.

9. The transistor structure according to claim 6, wherein the substrate is a silicon substrate, and the channel layer is formed by a selective growth process.

10. The transistor structure according to claim 1, further comprising a channel layer surrounding the gate dielectric layer, wherein the channel layer is a doped layer within the substrate.

11. A transistor structure comprising:
a substrate;

a gate conductive region, at least a portion of the gate conductive region disposed below a surface of the substrate;
a gate dielectric layer surrounding a bottom wall and sidewalls of the gate conductive region; and
a first conductive region;
wherein a bottom wall of the first conductive region is aligned or substantially aligned with a top wall of the gate conductive region;
wherein the gate dielectric layer includes a horizontal extension portion covering a top wall of the first conductive region.

12. The transistor structure according to claim 11, a top surface of one terminal of the channel layer is aligned or substantially aligned with the surface of the substrate.

13. The transistor structure according to claim 11, wherein the gate conductive region includes a tungsten plug and a titanium nitride (TiN) layer surrounding the tungsten plug.

14. A transistor structure comprising:
a substrate;
a gate conductive region, at least a portion of the gate conductive region disposed below a surface of the substrate;
a gate dielectric layer surrounding a bottom wall and sidewalls of the gate conductive region; and
a first conductive region adjacent to the gate conductive region and independent from the substrate;
wherein a distance of a vertical gap or a vertical overlap between a bottom wall of the first conductive region and a top wall of the gate conductive region is smaller than 5 nm, and the first conductive region includes an epitaxial semiconductor layer extending upward from the bottom wall of the first conductive region.

15. The transistor structure according to claim 14, wherein a doping concentration from the bottom wall of the first conductive region to a top wall of the first conductive region is vertically adjustable.

16. The transistor structure according to claim 15, wherein the substrate is a silicon substrate, and the first conductive region with the vertically adjustable doping concentration is formed by a selective growth process.

17. A transistor structure comprising:
a substrate;
a gate conductive region, at least a portion of the gate conductive region disposed below a surface of the substrate;
a gate dielectric layer surrounding a bottom wall and sidewalls of the gate conductive region;
a channel layer surrounding the gate dielectric layer; and
a first conductive region contacted to the channel layer;
wherein the channel layer is a composite layer and independent from the substrate.

18. The transistor structure according to claim 17, wherein the composite layer includes a high mobility sublayer and a silicon sublayer over the high mobility sublayer.

19. The transistor structure according to claim 18, wherein the high mobility sublayer is a doped $Si_{1-x}Ge_x$, $Si_{1-x}C_x$, $Ga_{1-x}As_x$, or $In_{1-x}As_x Sb$ layer.

20. A transistor structure comprising:
a substrate;
a gate conductive region, at least a portion of the gate conductive region disposed below a surface of the substrate;
a gate dielectric layer surrounding a bottom wall and sidewalls of the gate conductive region; and
a first conductive region;
wherein a top wall of the first conductive region is lower than a top wall of a shallow trench isolator (STI) region next to the first conductive region, and lower than a top wall of a gate cap layer on the gate conductive region.

21. The transistor structure according to claim 20, wherein a bottom wall of the first conductive region is aligned or substantially aligned with a top wall of the gate conductive region.

* * * * *